(12) United States Patent
    Xiao et al.

(10) Patent No.:     US 12,694,184 B2
(45) Date of Patent:          Jul. 28, 2026

(54) AUTOMATED POWER DISCRETE AND MODULE MODEL GENERATION FOR SYSTEM LEVEL SIMULATORS

(71) Applicant: SEMICONDUCTOR COMPONENTS INDUSTRIES, LLC, Phoenix, AZ (US)

(72) Inventors: Yun Peng Xiao, Shanghai (CN); James Joseph Victory, Trabuco Canyon, CA (US); Bejoy N. Pushpakaran, Phoenix, AZ (US); Ondrej Picha, Trojanovice (CZ); Wai Lun Chu, Kowloon (HK); Sravan Vanaparthy, Phoenix, AZ (US)

(73) Assignee: SEMICONDUCTOR COMPONENTS INDUSTRIES, LLC, Scottsdale, AZ (US)

( * ) Notice:    Subject to any disclaimer, the term of this patent is extended or adjusted under 35 U.S.C. 154(b) by 918 days.

(21) Appl. No.: 18/058,382

(22) Filed:    Nov. 23, 2022

(65)            Prior Publication Data

US 2024/0169136 A1      May 23, 2024

(51) Int. Cl.
      *G06F 30/367*          (2020.01)
(52) U.S. Cl.
      CPC ................................. *G06F 30/367* (2020.01)
(58) Field of Classification Search
      USPC .......................................................... 716/106
      See application file for complete search history.

(56)            References Cited

U.S. PATENT DOCUMENTS 11,481,532  B2     10/2022   Victory et al.
      11,481,533  B2     10/2022   Victory et al.

2009/0183127  A1*    7/2009   Bell ......................... G06F 30/33
                                                          716/136
      2021/0117598  A1*    4/2021   Victory ..................... G06N 3/08
      2022/0164516  A1*    5/2022   Mun ...................... H10D 89/811

OTHER PUBLICATIONS

Xiao Yunpeng, et al., "Corner and Statistical SPICE Model Generation for Shielded-Gate Trench Power MOSFETs Based on Backward Propagation of Variance," Proceedings of the IEEE Applied Power Electronics Conference and Exposition, Mar. 17, 2019 (Mar. 17, 2019), pp. 508-515.
Arnab Khawas et al., "A Top-Down approachto automated generation of high-level SPICE model of Buck Regulator", Proceedings of Annual IEEE India Conference, Dec. 16, 2011 (Dec. 16, 2011), pp. 1-6.

* cited by examiner

*Primary Examiner* — Mohammed Alam
(74) *Attorney, Agent, or Firm* — IPTechLaw

(57)            ABSTRACT

Implementations of a method of generating a product system model may include, using a first interface, receiving from a user a selection of a product type; selecting a product SPICE model associated with the product type from a database of product SPICE models; and using a second interface, receiving from the user a selection of a process condition. The method may include, using a third interface, receiving from the user one or more system characteristics and one or more operating characteristics; using a fourth interface, receiving from the user one or more circuit characteristics; using a SPICE model simulation module, generating a SPICE model output with the product SPICE model, and, using a formatting module, formatting the SPICE model output into a product system model file, the product system model file including one of a structured text file, a plain text file, or a delimited text file.

20 Claims, 19 Drawing Sheets

```
<Variable>
  <Name>Rgoff</Name>
  <Description>Turn-off gate resistance</Description>
  <DefaultValue>1</DefaultValue>
  <MinValue>1</MinValue>
  <MaxValue>10</MaxValue>
</Variable>
</Variables>
<CustomTables>
  <Table2D>
    <Name>EonVsRg(Rg,id)</Name>
    <XAxis>1.000000 2.800000 4.600000 6.400000 8.200000 10.000000</XAxis>
    <YAxis>0 50.000000 100.000000 150.000000 200.000000 250.000000 300.000000 350.000000 400.000000 450.000000 500.000000 550.000000 600.000000 650.000000 700.000000 750.000000 800.000000 850.000000 900.000000 950.000000 1.000000E+03 1.050000E+03 1.100000E+03 1.150000E+03 1.200000E+03</YAxis>
    <FunctionValues scale="1">
      <YDimension>0 0 0 0 0 0</YDimension>
      <YDimension>3.0418E-03 3.5492E-03 4.0796E-03 4.6358E-03 5.2081E-03 5.7908E-03</YDimension>
      <YDimension>5.9892E-03 6.9804E-03 8.0789E-03 9.2794E-03 1.0535E-02 1.1812E-02</YDimension>
      <YDimension>9.8102E-03 1.1336E-02 1.3081E-02 1.5007E-02 1.7038E-02 1.9110E-02</YDimension>
      <YDimension>1.4546E-02 1.6556E-02 1.9115E-02 2.1844E-02 2.4731E-02 2.7684E-02</YDimension>
      <YDimension>2.0235E-02 2.2990E-02 2.6245E-02 2.9867E-02 3.3686E-02 3.7601E-02</YDimension>
      <YDimension>2.6934E-02 3.0372E-02 3.4506E-02 3.9088E-02 4.3929E-02 4.8881E-02</YDimension>
      <YDimension>3.4681E-02 3.8878E-02 4.3954E-02 4.9582E-02 5.5486E-02 6.1563E-02</YDimension>
      <YDimension>4.3533E-02 4.8535E-02 5.4637E-02 6.1353E-02 6.8424E-02 7.5667E-02</YDimension>
      <YDimension>5.3539E-02 5.9403E-02 6.6607E-02 7.4496E-02 8.2786E-02 9.1335E-02</YDimension>
      <YDimension>6.4724E-02 7.1539E-02 7.9907E-02 8.9070E-02 9.8687E-02 1.0850E-01</YDimension>
      <YDimension>7.7106E-02 8.4998E-02 9.4610E-02 1.0511E-01 1.1610E-01 1.2735E-01</YDimension>
      <YDimension>9.0730E-02 9.9832E-02 1.1075E-01 1.2270E-01 1.3513E-01 1.4785E-01</YDimension>
      <YDimension>1.0579E-01 1.1607E-01 1.2841E-01 1.4185E-01 1.5580E-01 1.7015E-01</YDimension>
      <YDimension>1.2231E-01 1.3385E-01 1.4764E-01 1.6266E-01 1.7827E-01 1.9424E-01</YDimension>
      <YDimension>1.4031E-01 1.5313E-01 1.6848E-01 1.8517E-01 2.0248E-01 2.2021E-01</YDimension>
      <YDimension>1.5983E-01 1.7405E-01 1.9107E-01 2.0950E-01 2.2865E-01 2.4816E-01</YDimension>
      <YDimension>1.8095E-01 1.9663E-01 2.1541E-01 2.3571E-01 2.5671E-01 2.7815E-01</YDimension>
      <YDimension>2.0368E-01 2.2093E-01 2.4157E-01 2.6380E-01 2.8684E-01 3.1030E-01</YDimension>
      <YDimension>2.2534E-01 2.4408E-01 2.6652E-01 2.9064E-01 3.1559E-01 3.4101E-01</YDimension>
      <YDimension>2.4726E-01 2.6752E-01 2.9177E-01 3.1779E-01 3.4469E-01 3.7208E-01</YDimension>
      <YDimension>2.8255E-01 3.0523E-01 3.3202E-01 3.6072E-01 3.9036E-01 4.2046E-01</YDimension>
      <YDimension>3.1270E-01 3.3734E-01 3.6647E-01 3.9753E-01 4.2958E-01 4.6219E-01</YDimension>
      <YDimension>3.4628E-01 3.7318E-01 4.0479E-01 4.3842E-01 4.7140E-01 5.0666E-01</YDimension>
      <YDimension>3.7899E-01 4.0809E-01 4.4214E-01 4.7829E-01 5.1149E-01 5.5370E-01</YDimension>
    </FunctionValues>
  </Table2D>
  <Table2D>
```

FIG. 5

<TurnOnLoss>
<ComputationMethod>Table and formula</ComputationMethod>
<Formula>E*(i>0)*lookup('EonVsRg(Rg,id)',Rgon,i)/lookup('EonVsRg(Rg,id)',0.5,25)</Formula>
<CurrentAxis>-1 0 50.000000 100.000000 150.000000 200.000000 250.000000 300.000000 350.000000 400.000000 450.000000 500.000000 550.000000 600.000000 650.000000 700.000000 750.000000 800.000000 850.000000 900.000000 950.000000 1.000000E+03 1.050000E+03 1.100000E+03 1.150000E+03 1.200000E+03 </CurrentAxis>
<VoltageAxis>-1 0 400.000000 500.000000 600.000000 </VoltageAxis>
<TemperatureAxis>25.000000 75.000000 125.000000 175.000000 </TemperatureAxis>
<Energy scale="1">
<Temperature>
<Voltage>0 0 0 0 0 0 0 0 0 0 0 0 0 0 0 0 0 0 0 0 0 0 0 0 0 0 </Voltage>
<Voltage>0 0 0 0 0 0 0 0 0 0 0 0 0 0 0 0 0 0 0 0 0 0 0 0 0 0 </Voltage>
<Voltage>0 0 1.9535E-03 3.1803E-03 4.4623E-03 5.8084E-03 7.2216E-03 8.7012E-03 1.0249E-02 1.1871E-02 1.3556E-02 1.5317E-02 1.7141E-02 1.9035E-02 2.1024E-02 2.3081E-02 0.025138 0.027195 0.029252 0.031309000000000003 0.03336600000000001 0.0354230000000000001 0.0388975 4.2372E-02 0.0458465 0.049321 </Voltage>
<Voltage>0 0 2.6761E-03 4.3689E-03 6.1461E-03 8.0174E-03 9.9879E-03 1.2052E-02 1.4214E-02 1.6478E-02 1.8830E-02 2.1285E-02 2.3835E-02 2.6487E-02 2.9236E-02 3.2099E-02 0.035136 3.8173E-02 4.1365E-02 4.4656E-02 0.047947000000000004 0.05123800000000006 0.054529000000000001 0.057820000000000001 0.061111000000000001 0.0644020000000001 </Voltage>
<Voltage>0 0 0.0033694 5.6651E-03 7.9608E-03 1.0372E-02 1.2904E-02 1.5554E-02 1.8337E-02 2.1246E-02 2.4261E-02 2.7410E-02 3.0678E-02 3.4078E-02 3.7594E-02 4.1238E-02 4.5057E-02 4.8979E-02 5.3061E-02 5.7283E-02 6.1667E-02 6.6201E-02 0.0715485 7.6896E-02 0.082243500000000001 0.087591000000000002 </Voltage>
</Temperature>
<Temperature>
<Voltage>0 0 0 0 0 0 0 0 0 0 0 0 0 0 0 0 0 0 0 0 0 0 0 0 0 0 </Voltage>
<Voltage>0 0 0 0 0 0 0 0 0 0 0 0 0 0 0 0 0 0 0 0 0 0 0 0 0 0 </Voltage>
<Voltage>0 0 1.9755E-03 3.2353E-03 4.5535E-03 5.9378E-03 7.3826E-03 8.8939E-03 1.0473E-02 1.2119E-02 1.3827E-02 1.5605E-02 1.7445E-02 0.019394 2.1343E-02 0.023292 0.025241 0.027595 2.9949E-02 0.032303 0.034656999999999999 0.037198499999999999 3.9740E-02 0.0422815 0.044823 0.0473645000000000004 </Voltage>
<Voltage>0 0 2.7051E-03 4.4202E-03 6.2453E-03 8.1504E-03 1.0154E-02 1.2052E-02 1.4169E-02 1.6369E-02 0.018704 2.1039E-02 0.023547 2.6055E-02 2.9273E-02 3.2491E-02 3.5710E-02 3.8928E-02 4.2146E-02 4.5364E-02 4.8583E-02 5.1801E-02 5.5019E-02 5.8814E-02 6.2608E-02 6.6403E-02 </Voltage>
<Voltage>0 0 3.5158E-03 5.7512E-03 8.0940E-03 1.0554E-02 1.3125E-02 1.5821E-02 1.8624E-02 2.1547E-02 2.4587E-02 2.7740E-02 3.1021E-02 3.4388E-02 3.7906E-02 0.041424 0.044942 0.04846 0.052872 5.7284E-02 0.0616235 6.5963E-02 0.0703024999999999999 0.07464199999999999999 0.078981499999999998 0.0833220999999999998 </Voltage>
</Temperature>
<Temperature>
<Voltage>0 0 0 0 0 0 0 0 0 0 0 0 0 0 0 0 0 0 0 0 0 0 0 0 0 0 </Voltage>
<Voltage>0 0 0 0 0 0 0 0 0 0 0 0 0 0 0 0 0 0 0 0 0 0 0 0 0 0 </Voltage>
<Voltage>0 0 1.9715E-03 3.2490E-03 4.5925E-03 6.0011E-03 7.4765E-03 9.0167E-03 1.0621E-02 1.2290E-02 1.4018E-02 1.5821E-02 0.0176240000000000004 0.019427000000000007 0.021523000000000004 2.3619E-02 0.0257575000000000003 2.7896E-02 3.0136E-02 3.2436E-02 0.0348435 3.7251E-02 3.9765E-02 4.2350E-02 4.5008E-02 4.7732E-02 </Voltage>
<Voltage>0 0 2.7035E-03 4.4371E-03 6.2485E-03 8.1469E-03 1.0130E-02 1.2202E-02 1.4357E-02 0.016636 1.8915E-02 2.1320E-02 0.0238448 2.6376E-02 0.0290749999999999997 3.1774E-02 0.0344473 0.037172 0.039871 0.045269 0.045269 0.047968 0.0524155 5.6863E-02 0.0613105 0.065758 </Voltage>
<Voltage>0 0 3.5208E-03 5.7742E-03 8.1480E-03 1.0644E-02 1.3257E-02 1.5984E-02 1.8822E-02 2.1771E-02 2.4830E-02 2.7993E-02 0.0313300000000000004 3.4667E-02 0.038214 4.1761E-02 0.045308 0.0492849999999999995 5.3262E-02 0.057307 0.0615475 6.5788E-02 7.0224E-02 0.0746599999999999999 0.0790959999999999 0.0835319999999998 </Voltage>
</Temperature>
<Temperature>
<Voltage>0 0 0 0 0 0 0 0 0 0 0 0 0 0 0 0 0 0 0 0 0 0 0 0 0 0 </Voltage>
<Voltage>0 0 0 0 0 0 0 0 0 0 0 0 0 0 0 0 0 0 0 0 0 0 0 0 0 0 </Voltage>
<Voltage>0 0 1.9591E-03 3.2431E-03 4.6051E-03 6.0365E-03 7.5372E-03 9.0998E-03 0.0107579 1.2416E-02 1.4165E-02 1.5975E-02 1.7845E-02 1.9772E-02 0.0227795 0.0243181875 2.5858E-02 0.0392085 4.1624E-02 4.4148E-02 </Voltage>
<Voltage>0 0 2.6940E-03 4.4373E-03 6.2766E-03 8.2082E-03 1.0229E-02 1.2335E-02 1.4525E-02 1.6795E-02 1.9155E-02 2.1587E-02 2.4096E-02 2.6687E-02 2.9356E-02 3.2111E-02 3.4936E-02 3.7837E-02 0.040864 4.3891E-02 0.0470865 5.3600E-02 5.7008E-02 0.0604160000000000004 0.063824 </Voltage>
<Voltage>0 0 3.5144E-03 5.7830E-03 8.1853E-03 1.0710E-02 1.3356E-02 1.6119E-02 1.8989E-02 2.1967E-02 2.5051E-02 2.8240E-02 3.1520E-02 3.4926E-02 3.8411E-02 0.0420685 4.5726E-02 0.049583 5.3440E-02 5.7471E-02 6.1607E-02 6.5829E-02 7.0180E-02 7.4677E-02 7.9236E-02 0.0837950000000000001 </Voltage>
</Temperature>
</Energy>
</TurnOnLoss>

FIG. 6

AC Characteristics

VDD=600
V,RG_ON
=4.9Ω,RG
_OFF=4.9
_Ω

| Ids | eoff(J) | | | | eon(J) | | | | err(J) | | | |
|---|---|---|---|---|---|---|---|---|---|---|---|---|
| | 25°C | 85°C | 125°C | 175°C | 25°C | 85°C | 125°C | 175°C | 25°C | 85°C | 125°C | 175°C |
| 1 | 3.54E-05 | 3.64E-05 | 3.7E-05 | 3.77E-05 | 7.03E-05 | 7.05E-05 | 7.06E-05 | 7.08E-05 | 4.44E-05 | 4.75E-05 | 4.92E-05 | 5.11E-05 |
| 6 | 3.63E-05 | 3.73E-05 | 3.79E-05 | 3.87E-05 | 9.51E-05 | 9.51E-05 | 9.49E-05 | 9.55E-05 | 4.81E-05 | 5.28E-05 | 5.57E-05 | 5.9E-05 |
| 11 | 3.81E-05 | 3.92E-05 | 3.99E-05 | 4.07E-05 | 0.000118 | 0.000118 | 0.000117 | 0.000118 | 5.15E-05 | 5.79E-05 | 6.2E-05 | 6.68E-05 |
| 16 | 4.09E-05 | 4.24E-05 | 4.34E-05 | 4.46E-05 | 0.000142 | 0.00014 | 0.000139 | 0.000139 | 5.49E-05 | 6.31E-05 | 6.84E-05 | 7.44E-05 |
| 21 | 4.54E-05 | 4.78E-05 | 4.96E-05 | 5.19E-05 | 0.000166 | 0.000162 | 0.000161 | 0.00016 | 5.83E-05 | 6.82E-05 | 7.48E-05 | 8.22E-05 |
| 26 | 5.2E-05 | 5.63E-05 | 5.93E-05 | 6.31E-05 | 0.000191 | 0.000185 | 0.000182 | 0.000181 | 6.17E-05 | 7.35E-05 | 8.13E-05 | 9.03E-05 |
| 31 | 6.05E-05 | 6.66E-05 | 7.13E-05 | 7.68E-05 | 0.000218 | 0.000208 | 0.000204 | 0.000201 | 6.52E-05 | 7.89E-05 | 8.8E-05 | 9.87E-05 |
| 36 | 7.09E-05 | 7.88E-05 | 8.49E-05 | 9.21E-05 | 0.000246 | 0.000232 | 0.000225 | 0.000221 | 6.88E-05 | 8.46E-05 | 9.5E-05 | 0.000108 |
| 41 | 8.28E-05 | 9.22E-05 | 9.96E-05 | 0.000108 | 0.000275 | 0.000257 | 0.000248 | 0.000242 | 7.26E-05 | 9.05E-05 | 0.000102 | 0.000117 |
| 46 | 9.58E-05 | 0.000107 | 0.000115 | 0.000126 | 0.000307 | 0.000283 | 0.000271 | 0.000262 | 7.67E-05 | 9.68E-05 | 0.00011 | 0.000126 |
| 51 | 0.00011 | 0.000123 | 0.000133 | 0.000145 | 0.000341 | 0.00031 | 0.000295 | 0.000283 | 8.13E-05 | 0.000103 | 0.000118 | 0.000137 |
| 56 | 0.000126 | 0.00014 | 0.000151 | 0.000165 | 0.000378 | 0.000338 | 0.000319 | 0.000305 | 8.63E-05 | 0.000111 | 0.000127 | 0.000148 |
| 61 | 0.000142 | 0.000158 | 0.00017 | 0.000185 | 0.000417 | 0.000367 | 0.000344 | 0.000326 | 9.29E-05 | 0.000119 | 0.000137 | 0.00016 |

FIG. 7

DC Characteristics   RDSON(Ω)

MOSFET Fwd

| Ids | | 25°C Rdson(Ω) | 85°C Rdson(Ω) | 125°C Rdson(Ω) | 175°C Rdson(Ω) |
|---|---|---|---|---|---|
| | -60 | 0.033362 | 0.034745 | 0.038361 | 0.045498 |
| | -55 | 0.033613 | 0.03531 | 0.039408 | 0.04734 |
| | -50 | 0.033814 | 0.035795 | 0.040422 | 0.049332 |
| | -45 | 0.033986 | 0.036207 | 0.041354 | 0.051432 |
| | -40 | 0.034144 | 0.036566 | 0.042171 | 0.053531 |
| | -35 | 0.034306 | 0.036898 | 0.042872 | 0.055474 |
| | -30 | 0.034489 | 0.037218 | 0.04349 | 0.057161 |
| | -25 | 0.034707 | 0.037541 | 0.044064 | 0.058585 |
| | -20 | 0.034972 | 0.037892 | 0.044617 | 0.059835 |
| | -15 | 0.035305 | 0.038294 | 0.045174 | 0.060988 |
| | -10 | 0.035743 | 0.038775 | 0.04578 | 0.062089 |
| Vds.on,V | -5 | 0.036352 | 0.039382 | 0.046478 | 0.063237 |
| gs=20V | 0 | 0.036352 | 0.039382 | 0.046478 | 0.063237 |
| | 5 | 0.0376 | 0.040377 | 0.047377 | 0.064272 |
| | 10 | 0.037918 | 0.040552 | 0.047432 | 0.064054 |
| | 15 | 0.038249 | 0.040734 | 0.047494 | 0.063856 |
| | 20 | 0.038592 | 0.040923 | 0.047564 | 0.063677 |
| | 25 | 0.03895 | 0.041119 | 0.047641 | 0.063516 |
| | 30 | 0.039323 | 0.041323 | 0.047727 | 0.063371 |
| | 35 | 0.039711 | 0.041536 | 0.04782 | 0.063242 |
| | 40 | 0.040116 | 0.041756 | 0.04792 | 0.063129 |
| | 45 | 0.04054 | 0.041986 | 0.048029 | 0.06303 |
| | 50 | 0.040983 | 0.042225 | 0.048146 | 0.062946 |
| | 55 | 0.041447 | 0.042474 | 0.048271 | 0.062876 |
| | 60 | 0.041933 | 0.042733 | 0.048405 | 0.06282 |

Use a first interface generated by a computing device to receive from a user a selection of a product type

152

Select, using a processor, a product SPICE model associated with the product type from a database of product SPICE models

154

Use a second interface generated by a computing device to receive from the user a selection of a process condition

156

Use a third interface generated by a computing device to receive from the user one or more system characteristics and one or more operating characteristics

158

Use a fourth interface generated by the computing device to receive from the user one or more circuit characteristics

160

Using the processor and a SPICE simulation module to generate a SPICE model output with the product SPICE model, the process condition, the one or more system characteristics, the one or more operating characteristics, and the one or more circuit characteristics

162

Use the processor and a formatting module to format the SPICE model output into a product system model file which is a structured text file, a plain text file, or a delimited text file

FIG. 19

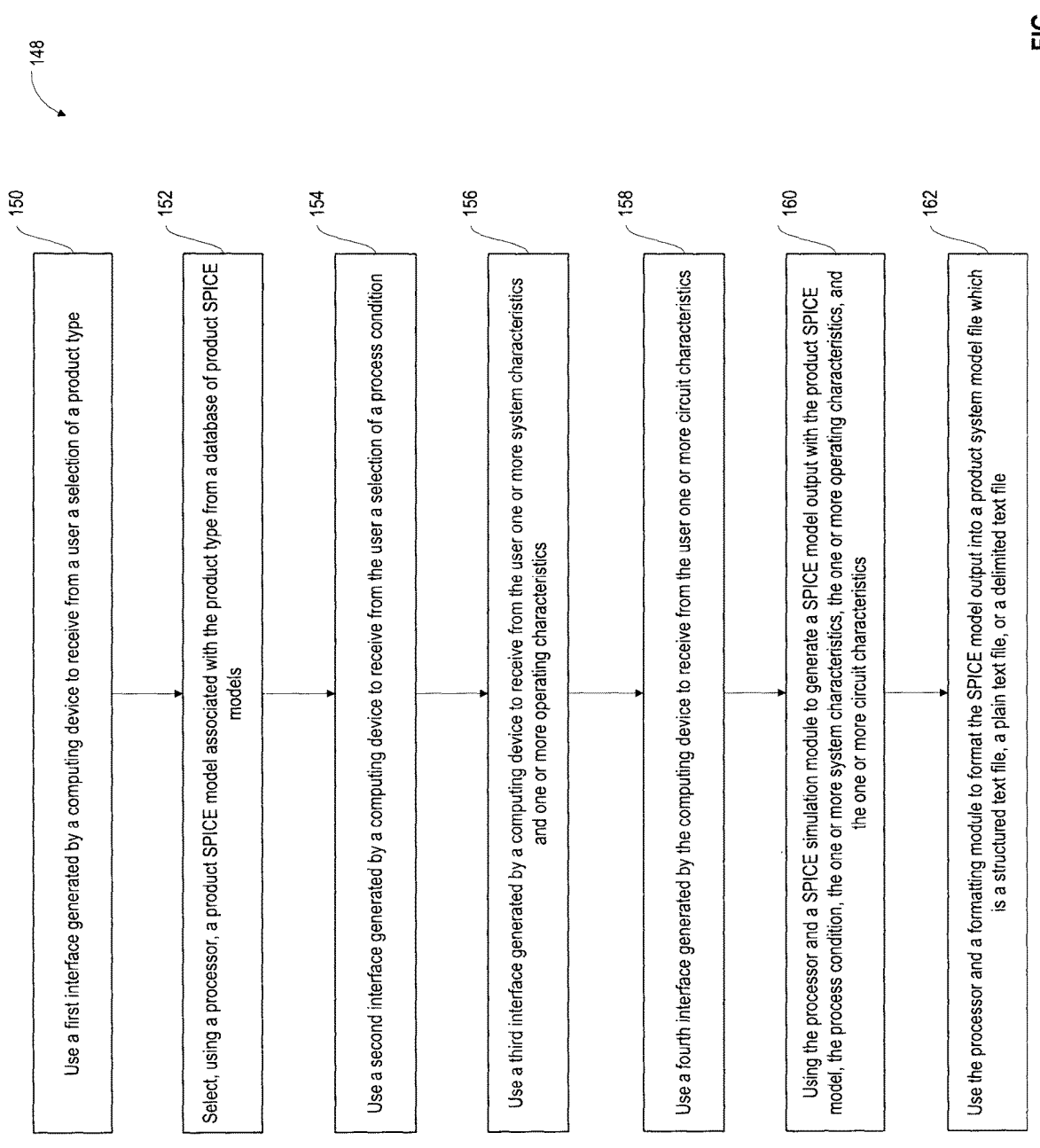

AUTOMATED POWER DISCRETE AND MODULE MODEL GENERATION FOR SYSTEM LEVEL SIMULATORS

BACKGROUND

1. Technical Field

Aspects of this document relate generally to electronic system simulation. More specific implementations involve systems and methods for simulating systems that include semiconductor die.

2. Background

Semiconductor die are incorporated into larger electronic systems like motherboards or circuit boards through being directly attached or attached through a packaging system attached to the semiconductor die. The motherboards or circuit boards are designed to supply/receive certain electronic signals from the semiconductor die during operation.

SUMMARY

Implementations of a method of generating a product system model for use in system level simulations may include, using a first interface generated by a computing device, receiving from a user a selection of a product type; selecting, using a processor, a product SPICE model associated with the product type from a database of product SPICE models; and using a second interface generated by the computing device, receiving from the user a selection of a process condition. The method may include, using a third interface generated by the computing device, receiving from the user one or more system characteristics and one or more operating characteristics; using a fourth interface generated by the computing device, receiving from the user one or more circuit characteristics; and using the processor and a SPICE model simulation module, generating a SPICE model output with the product SPICE model, the process condition, the one or more system characteristics, the one or more operating characteristics, and the one or more circuit characteristics. The method may also include, using the processor and a formatting module, formatting the SPICE model output into a product system model file, the product system model file including one of a structured text file, a plain text file, or a delimited text file.

Implementations of a method of generating a product system file for use in system level simulations may include one, all, or any of the following:

The product system model file may be configured to be used to perform a system level simulation of a system including the product type.

Receiving from the user the selection of the product type further may include receiving a selection of one of a product die type, a product technology type, a product voltage level, a device type, and any combination thereof.

Receiving from the user the selection of the process condition further may include receiving a selection of one of a nominal condition, a worst conduction loss/best case switching loss, or a best case conduction loss/worst case switching loss.

The one or more system characteristics may include one of a number of devices and one or more temperatures.

The one or more operating characteristics further may include one of at least one direct current characteristic, at least one switching characteristic, at least one gate threshold voltage, or any combination thereof.

The one or more circuit characteristics further include one of gate resistance, gate inductance, gate loop inductance, source inductance, loop inductance, diode voltage, and any combination thereof.

The fourth interface further may include a circuit schematic.

The product system model file may be a structured text file configured to be used by a Piecewise Linear Electrical Circuit Simulation system.

The product type may include a discrete power semiconductor die.

Implementations of a system for generating a system model for use in system level simulations may include one or more hardware processors configured by machine-readable instructions to use a first interface generated by a computing device to receive from a user a selection of a product type; select a product SPICE model associated with the product type from a database of product SPICE models; and use a second interface generated by a computing device to receive from the user a selection of a process condition. The system may further include using a third interface generated by a computing device to receive from the user one or more system characteristics and one or more operating characteristics; use a fourth interface generated by a computing device to receive from the user one or more circuit characteristics; and use a SPICE model simulation module to generate a SPICE model output with the product SPICE model, the process condition, the one or more system characteristics, the one or more operating characteristics, and the one or more circuit characteristics. The system may further use a formatting module to format the SPICE model output into a product system model file, the product system model file including one of a structured text file, a plain text file, or a delimited text file.

Implementations of a system for generating a system model for use in system level simulations may include one, all, or any of the following:

The product system model file may be configured to be used to perform a system level simulation of a system including the product type.

The selection of the product type further may include a selection of one of a product die type, a product technology type, a product voltage level, a device type, and any combination thereof.

The selection of the process condition further may include a selection of a nominal condition, a worst conduction loss/best case switching loss, or a best case conduction loss/worst case switching loss.

The one or more system characteristics include one of a number of devices and one or more temperatures.

The one or more operating characteristics further may include one of at least one direct current characteristic, at least one switching characteristic, at least one gate threshold voltage, or any combination thereof.

The one or more circuit characteristics further include one of gate resistance, gate inductance, gate loop inductance, source inductance, loop inductance, diode voltage, and any combination thereof.

The fourth interface further may include a circuit schematic.

The product system model file may be a structured text file configured to be used by a Piecewise Linear Electrical Circuit Simulation system.

The product type may include a discrete power semiconductor die:

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 5 is an illustration of a first portion of a system model file that includes a structured text file;

FIG. 6 is an illustration of a second portion of the system model file of FIG. 5;

FIG. 7 is an illustration of a first portion of a system model file in a file viewer that includes a structure text file;

FIG. 8 is an illustration of a second portion of a system model file of FIG. 7;

FIG. 19 is a flow chart of an implementation of a method of generating a system model for use in system level simulations.

DESCRIPTION

Figure 1:
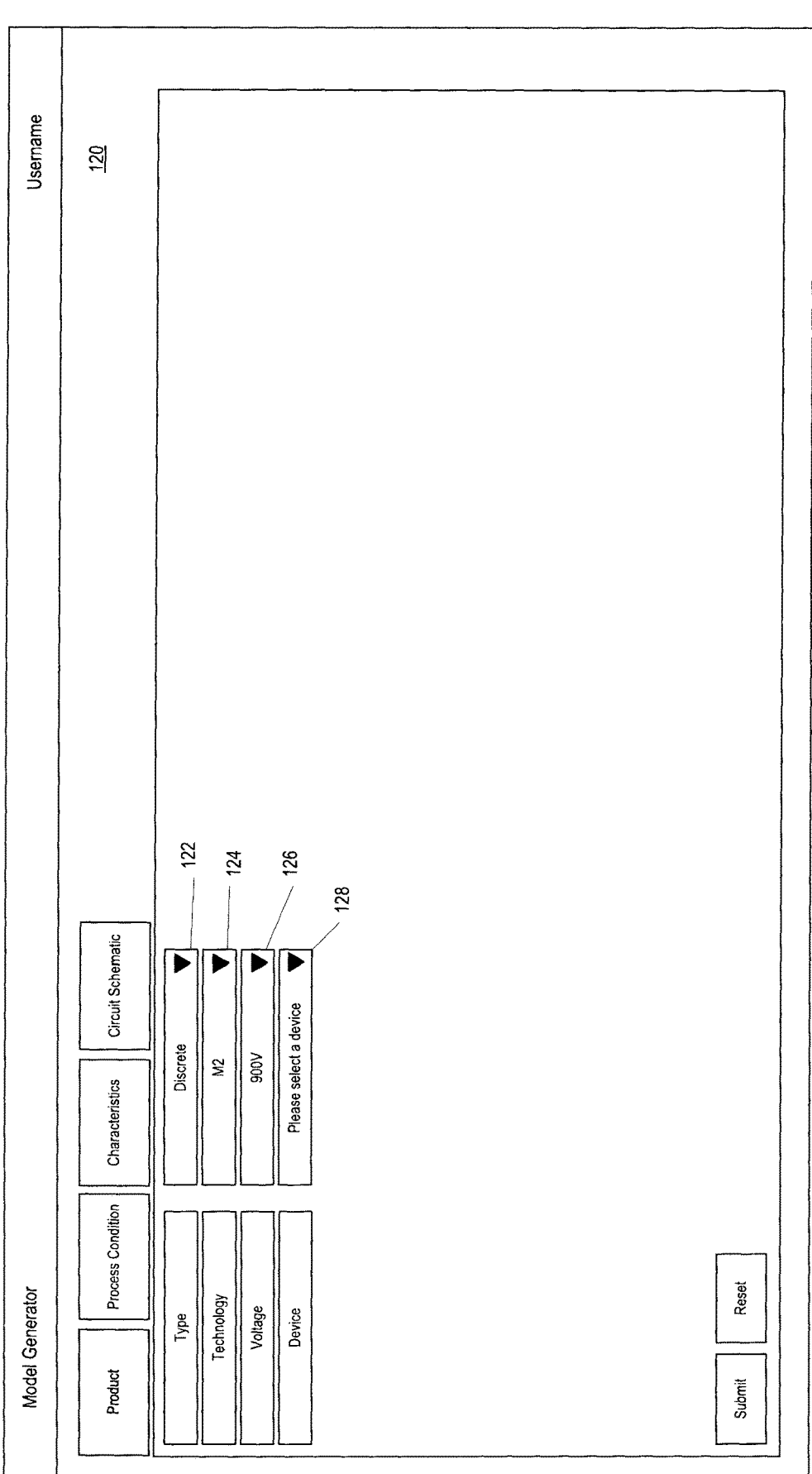
FIG. 1 is a diagram of a first interface generated by a computing device.

This disclosure, its aspects and implementations, are not limited to the specific components, assembly procedures or method elements disclosed herein. Many additional components, assembly procedures and/or method elements known in the art consistent with the intended systems and methods for generating product system models for use in system level simulators will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such systems and methods for generating product system models for use in system level simulators, and implementing components and methods, consistent with the intended operation and methods.

The various system and method implementations herein utilize product SPICE models that are constructed using simulations carried out that integrate a semiconductor die with a corresponding package (semiconductor package). These product SPICE models correspond with a particular product sold by a semiconductor product manufacturer that a circuit designer wants to incorporate into a particular system design. The system being designed may be a circuit board or motherboard that uses the semiconductor product as a component or for which the entire circuit board or motherboard is designed for. Semiconductor products ordinarily are sold in association with a datasheet that contains electrical performance, electrical characteristics, and package configuration information (pin out, etc.) that the circuit designer needs to know in order to incorporate the semiconductor product into the board design properly.

Circuit designers utilize system level simulators that simulate the semiconductor product as part of determining the entire system's electrical performance/characteristics. In the case of power semiconductor systems, the system level simulators allow the circuit designer to simulate the electrical power characteristics of the system/device being designed. In the case of a power converter device, the system level simulator permits the simulation of various power converter topologies. The system level simulators take as an input a product system file for the particular semiconductor product that includes models of conduction losses, switching energy losses, and thermal impedance data. Ordinarily, the data for these models comes from data on a datasheet for the semiconductor product which was obtained by physically testing an as-assembled semiconductor product in a lab set up. The challenge with the datasheet data obtained in this ways is that the loss-related data is dependent on the parasitics of the lab measurement set up and of the parasitics of the lab testing circuit(s). Furthermore, the data collected in the lab is not often dense enough to ensure accurate interpolation/extrapolation for the semiconductor product. Indeed, the quantity of data available creates a situation where significant extrapolation with insufficient data points is required by the system level simulator. Furthermore, the lab testing process marginalities affect/bias the simulation results and cannot be corrected for/estimated because the only data available includes all the lab set up errors. The foregoing create situations where overdesign, underdesign, or marginal design can occur simply because the circuit designer is working with inaccurate information about the semiconductor product's actual performance when actually installed in the actual system. This can result in prototype and field failures and can greatly increase the time and expense associated with doing the circuit/board design.

Another way of looking at the issues created during lab measurements is that the potential unknowns created by the particular lab setup(s) used to obtain datasheet data become one of what can be an infinite quantity of boundary conditions that are statistically unlikely to line up with the particular boundary conditions a circuit designer who designed the semiconductor product with. Since the parasitics of the lab setup (and other factors associated with temporary testing of a part) add additional variation, this variation winds up reducing the likelihood that the lab test result results accurately reflect the actual real-world performance of the part consistent with what the designer intended.

The product SPICE models for the semiconductor products disclosed herein are derived through modeling carried out using either or both of the modeling processes disclosed in U.S. Pat. No. 11,481,532 to Victory et al., "Systems and Methods for Designing a Discrete Device Product," issued Oct. 25, 2022 ('522 Patent), and U.S. Pat. No. 11,481,533 to Victory et al., "Systems and Methods for Designing a Module Semiconductor Product," issued Oct. 25, 2022 ('533 Patent), the disclosures of each of which are incorporated entirely herein by reference. The term "product SPICE model" as used herein thus means the same as the corresponding "product SPICE model" as used in each of the '532 and '533 Patents. These product SPICE models are the result of significant simulations that take into account the electrical/thermal characteristics of one or more semiconductor die and the electrical/thermal characteristics of the corresponding packaging to which the one or more semiconductor die are coupled and which are used to provide electrical/thermal connections to a circuit or motherboard to which the semiconductor product is coupled. Because of this, these product SPICE models are unlike the datasheet data provided using the ordinary lab testing process as these models, as models, do not include any of the losses/error caused by the lab equipment or test circuitry. Furthermore, the product SPICE models, as mathematically-based models, have the ability to be "tested" using a much more granular/numerous amount of inputs supplied to the product SPICE models with a corresponding ability to output a correspondingly more granular/number of outputs. Furthermore, the use of the product SPICE models for testing allows the circuit designer to apply the designer's boundary conditions to the product to get system data that matches the designer's boundary condition (without having to deal with additional unknown boundary conditions introduced through the lab testing set up). Finally, the system and method implementations disclosed herein allow the designer to take into account various parasitics associated with the circuit of the designer's system itself, which is simply not measurable/adjustable using ordinary lab testing setups.

The various system and method implementations disclosed herein utilize product SPICE models like those disclosed in the '532 and '533 Patents to create product system model files that can be used by various system level simulators used by circuit designers during circuit design. These product system model files may take the format of a structured text file, a plain text file, or a delimited text file in various implementations. In some implementations, the product system model file may be a structured text file in an xml format that is structured for use in a Piecewise Linear Electrical Circuit Simulation (PLECS) system level simulator (a PLECS model) marketed by Plexim of Zurich, Switzerland. In other implementations, the product system file may be a structured text, plain text or a delimited text file capable of being utilized in another system level simulator type like the one marketed under the tradename PSIM by Powersim, Inc. of Rockville, MD, or any other system level simulator.

Figure 18:
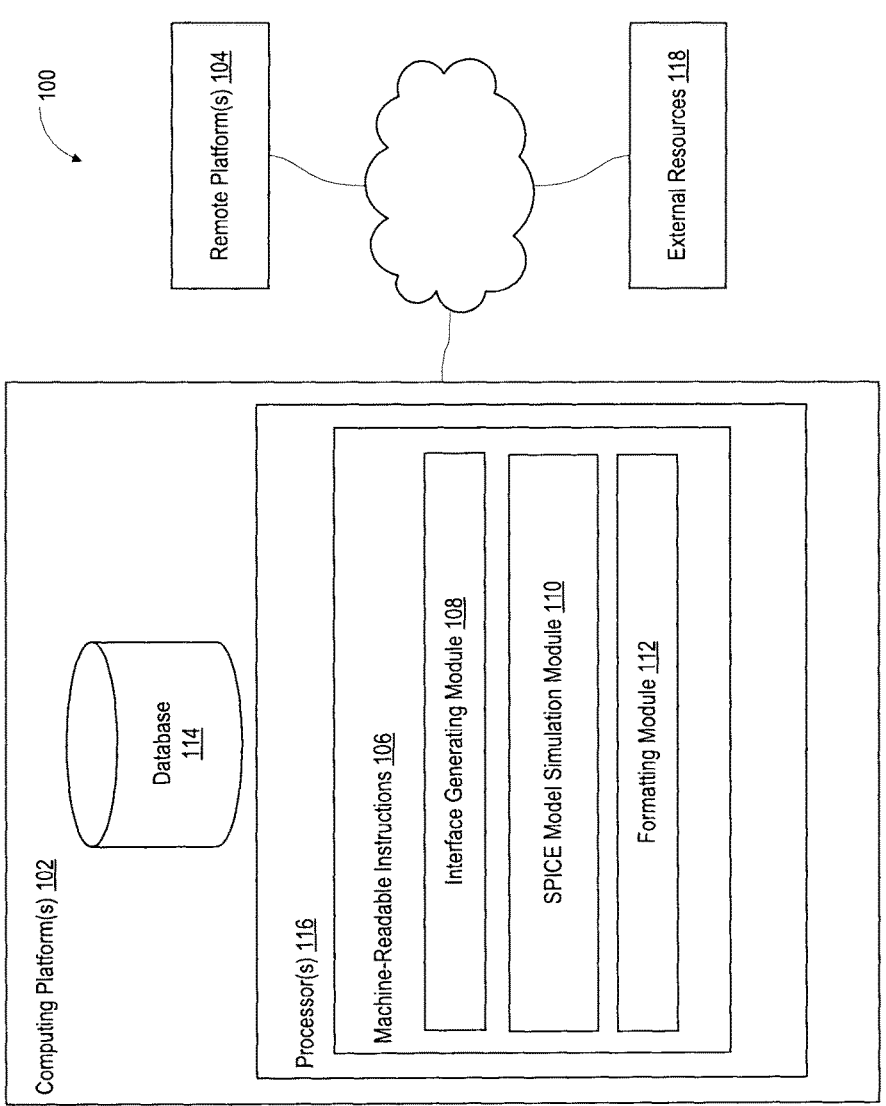
FIG. 18 is a block diagram of an implementation of a system for generating a system model for use in system level simulations.

Referring to FIG. 18, a block diagram of an implementation of a system 100 for generating a system model for using in system level simulations is illustrated. In some implementations, system 100 may include one or more computing platforms 102. Computing platform(s) 102 may be configured to communicate with one or more remote platforms 104 according to a client/server architecture, a peer-to-peer architecture, and/or other architectures. Remote platform(s) 104 may be configured to communicate with other remote platforms via computing platform(s) 102 and/or according to a client/server architecture, a peer-to-peer architecture, and/or other architectures. Users may access system 100 via remote platform(s) 104. Examples of remote platforms 104 that may be used by users include, by non-living example, desktop computers, server computers, laptop computers, smart phones, tablets, or any other portable electronic device.

Computing platform(s) 102 may be configured by machine-readable instructions 106. Machine-readable instructions 106 may include one or more instruction modules. The instruction modules may include computer program modules. The instruction modules may include one or more of an interface generating module 108, a SPICE model simulation module 110, and a formatting module 112. Interface generating module 108 works to generate the various computing interfaces illustrated in FIGS. 1-4 which will be described in more detail hereafter. SPICE model simulation module 110 carries out a series of simulations using a product SPICE model selected by the user that is stored in database 114 which contains a set of product SPICE models like those disclosed in the '532 and '533 Patents. The results of those simulations are then processed by formatting module 112 to form a product system model file. In various implementations, the product system model file may be stored in the database 114 for retrieval by the user or others who wish to access the file.

In some implementations, computing platform(s) 102, remote platform(s) 104, and/or external resources 118 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which computing platform(s) 102, remote platform(s) 104, and/or external resources 130 may be operatively linked via some other communication media.

A given remote platform 104 may include one or more processors configured to execute computer program modules. The computer program modules may be configured to enable an expert or user associated with the given remote platform 104 to interface with system 100 and/or external resources 118, and/or provide other functionality attributed herein to remote platform(s) 104. By way of non-limiting example, a given remote platform 104 and/or a given computing platform 102 may include one or more of a server, a desktop computer, a laptop computer, a handheld computer, a tablet computing platform, a NetBook, a Smartphone, a gaming console, and/or other computing platforms.

External resources 118 may include sources of information outside of system 100, external entities participating with system 100, and/or other resources. In some implementations, some or all of the functionality attributed herein to external resources 130 may be provided by resources included in system 100. As illustrated in FIG. 18, computing platform(s) 102 may include electronic storage/database 114, one or more processors 116, and/or other components. Computing platform(s) 102 may include communication lines, or ports to enable the exchange of information with a network and/or other computing platforms. Illustration of computing platform(s) 102 in FIG. 18 is not intended to be limiting. Computing platform(s) 102 may include a plurality of hardware, software, and/or firmware components operating together to provide the functionality attributed herein to computing platform(s) 102. For example, computing platform(s) 102 may be implemented by a cloud of computing platforms operating together as computing platform(s) 102.

Processor(s) 116 may be configured to provide information processing capabilities in computing platform(s) 102. As such, processor(s) 116 may include one or more of a digital processor, an analog processor, a digital circuit designed to process information, an analog circuit designed to process information, a state machine, and/or other mechanisms for electronically processing information. Although processor(s) 116 is shown in FIG. 18 as a single entity, this is for illustrative purposes only. In some implementations, processor(s) 116 may include a plurality of processing units. These processing units may be physically located within the same device, or processor(s) 116 may represent processing functionality of a plurality of devices operating in coordination. Processor(s) 116 may be configured to execute modules 108, 110, and/or 112, and/or other modules. Processor(s) 116 may be configured to execute modules 108, 110, and/or 112 and/or other modules by software; hardware; firmware; some combination of software, hardware, and/or firmware; and/or other mechanisms for configuring processing capabilities on processor(s) 116. As used herein, the term "module" may refer to any component or set of components that perform the functionality attributed to the module. This may include one or more physical processors during execution of processor readable instructions, the processor readable instructions, circuitry, hardware, storage media, or any other components.

It should be appreciated that although modules 108, 110, and/or 112 are illustrated in FIG. 18 as being implemented within a single processing unit, in implementations in which processor(s) 116 includes multiple processing units, one or more of modules 108, 110, and/or 112 may be implemented remotely from the other modules. The description of the functionality provided by the different modules 108, 110, and/or 112 described below is for illustrative purposes, and is not intended to be limiting, as any of modules 108, 110, and/or 112 may provide more or less functionality than is described. For example, one or more of modules 108, 110, and/or 112 may be eliminated, and some or all of its functionality may be provided by other ones of modules 108, 110, and/or 112. As another example, processor(s) 116 may be configured to execute one or more additional modules that may perform some or all of the functionality attributed below to one of modules 108, 110, and/or 112.

Referring to FIG. 1, an implementation of a first interface 120 is illustrated that is generated using interface generating module 108. As illustrated, the first interface 120 allows the user to identify/select the particular product type (and related information, such as by non-limiting example, product die type, product technology type, product voltage level, device type, or any combination thereof) for which a product system model file is to be generated by the system. As illustrated, the first interface 120 includes several drop down menus 122, 124, 126, 128 which aid the system in determine which product SPICE model(s) for which the user wishes to generate a product system model file. Dropdown menu 122 allows the user to select whether the product is a discrete product or a module product. Dropdown menu 124 allows the user to select what semiconductor process technology is associated with the desired product (in this case a silicon carbide M2 process technology, though any particular type of/naming convention for semiconductor process technology could be employed in various implementations). Dropdown menu 126 allows the user to select what voltage the product is designed to run at, and dropdown menu 128 allows the user to select from a list of specific device(s) that meet the requirements of the first three dropdown menus. Once the particular device type (part number) has been selected and the Submit/Save button in the interface 120 has been pressed, in various system implementations, the system then retrieves the specific product SPICE model from the database 114 and provides it to the SPICE model simulation module 110.

Figure 2:
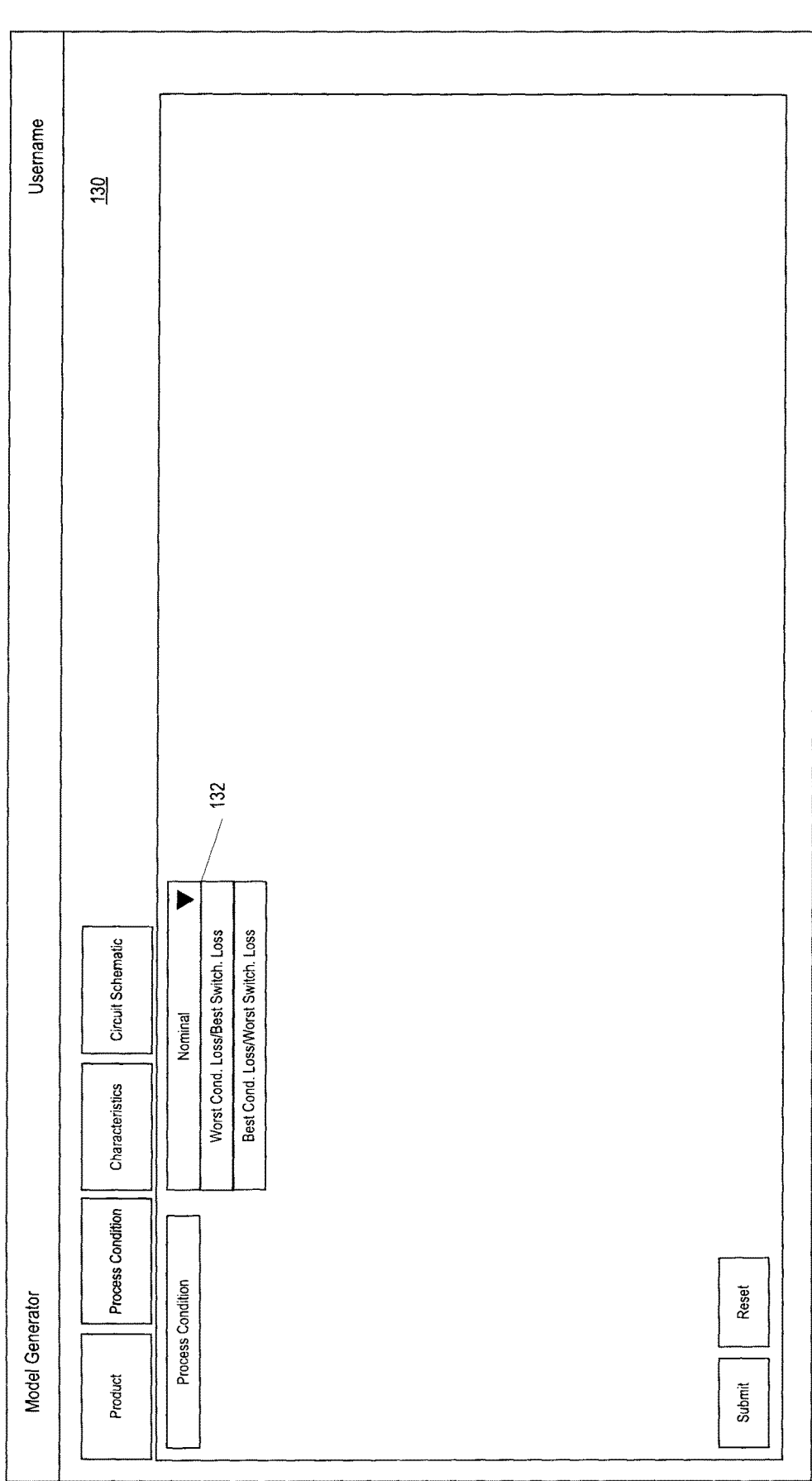
FIG. 2 is a diagram of a second interface generated by a computing device.

Referring to FIG. 2, an implementation of a second interface 130 is illustrated. This interface 130 permits the user to select the particular process condition(s) to be used by the SPICE simulation module 110 with the product SPICE model when carrying out the simulations. Process condition here refers to the state of the fabrication processing used to make the semiconductor die(s) included in the selected device/product. As illustrated, the interface 130 include a dropdown menu 132 that allows the user to select between three options, a nominal process condition (mean of a particular fab's processing conditions), a worst conduction loss/best switching loss process condition, or a best conduction loss/worst switching loss process condition. The tradeoff between conduction loss and switching loss occurs because in power semiconductor devices, as the capacitance goes up, the RdsON goes down and vice versa. As both of these device characteristics are a direct result of the particular fabrication processing received by a given power semiconductor die, a corner model can be used in various system and method implementations to indicate the effect of the worst and best case processing conditions observed coming out of a given fabrication facility manufacturing a particular semiconductor die. The foregoing is just an example of a particular type of corner model that focuses on the switching and conductions losses; in other implementations, corner models for any other device performance characteristic could also be used and included in the dropdown menu 132 for use in simulation. In various implementations, instead of a corner model, a Monte Carlo model could be used to simulate/indicate the full range of variation of the semiconductor processing for a given semiconductor die to increase the accuracy of simulations across the entire range of possible process conditions. In such an implementation, the product SPICE model selected would also be one generated using a similar Monte Carlo technique using the model generating principles disclosed in the '532 and '533 Patents. In various system implementations, once the Submit/Save button on the interface 130 has been selected, the particular product SPICE model corresponding with the selected process condition (nominal, etc.) is retrieved from the database 114 and provided to the SPICE model simulation module 110.

Figure 3:
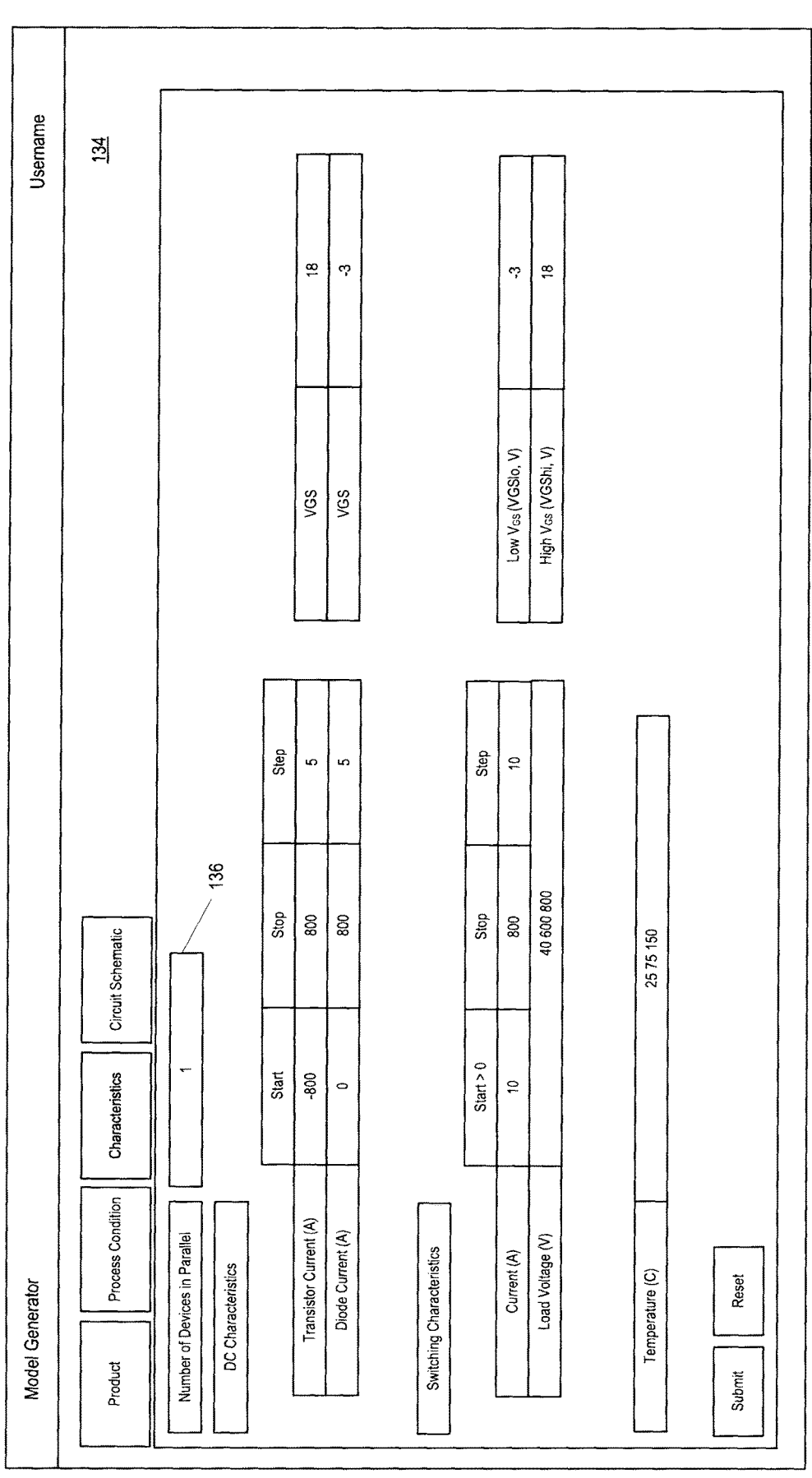
FIG. 3 is a diagram of a third interface generated by a computing device.

Referring to FIG. 3, an implementation of a third interface 134 is illustrated that is designed to allow the user to enter one or more system characteristics and one or more operating characteristics for which the modeling will be conducted using the product SPICE module by the SPICE model simulation module 110. As illustrated in FIG. 3, the system characteristic of the number of devices in parallel in the particular product/device selected can be entered by the user in textbox 136. The user can then enter a number of operating characteristics for the simulation such as, by non-limiting example, temperature, current, load voltage, voltage source-gate, or any other desired device/product operating parameters. In the implementation illustrated in FIG. 3, the user can enter a number of direct current (DC) characteristics and a number of switching characteristics along with a temperature. As illustrated in FIG. 3, a user-defined range of values can be entered into the text boxes as has illustrated for the Load Voltage under Switching Characteristics and for Temperature. The ability to input a range of values for the simulations at a desired level of granularity can allow the user to create a dense space to allow for accurate interpolation and minimize extrapolation by the system level simulator that utilizes the generated product system model file. In the various system and method implementations, the entered system characteristics and operating characteristics are then supplied to the SPICE model simulation model 110 when the user presses the Submit/Save button in the third interface 134.

Figure 4:
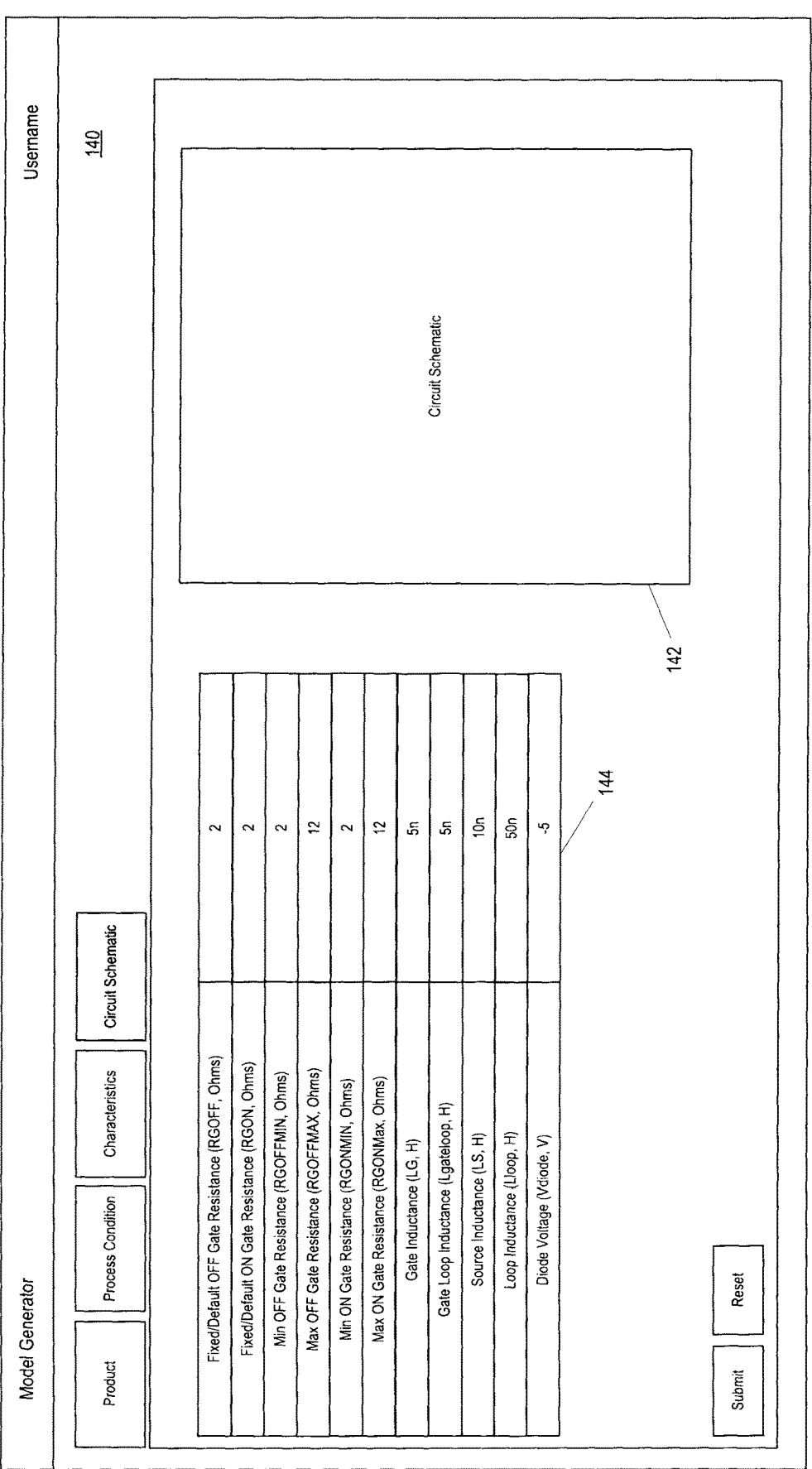
FIG. 4 is a diagram of a fourth interface generated by a computing device.
Figure 9:
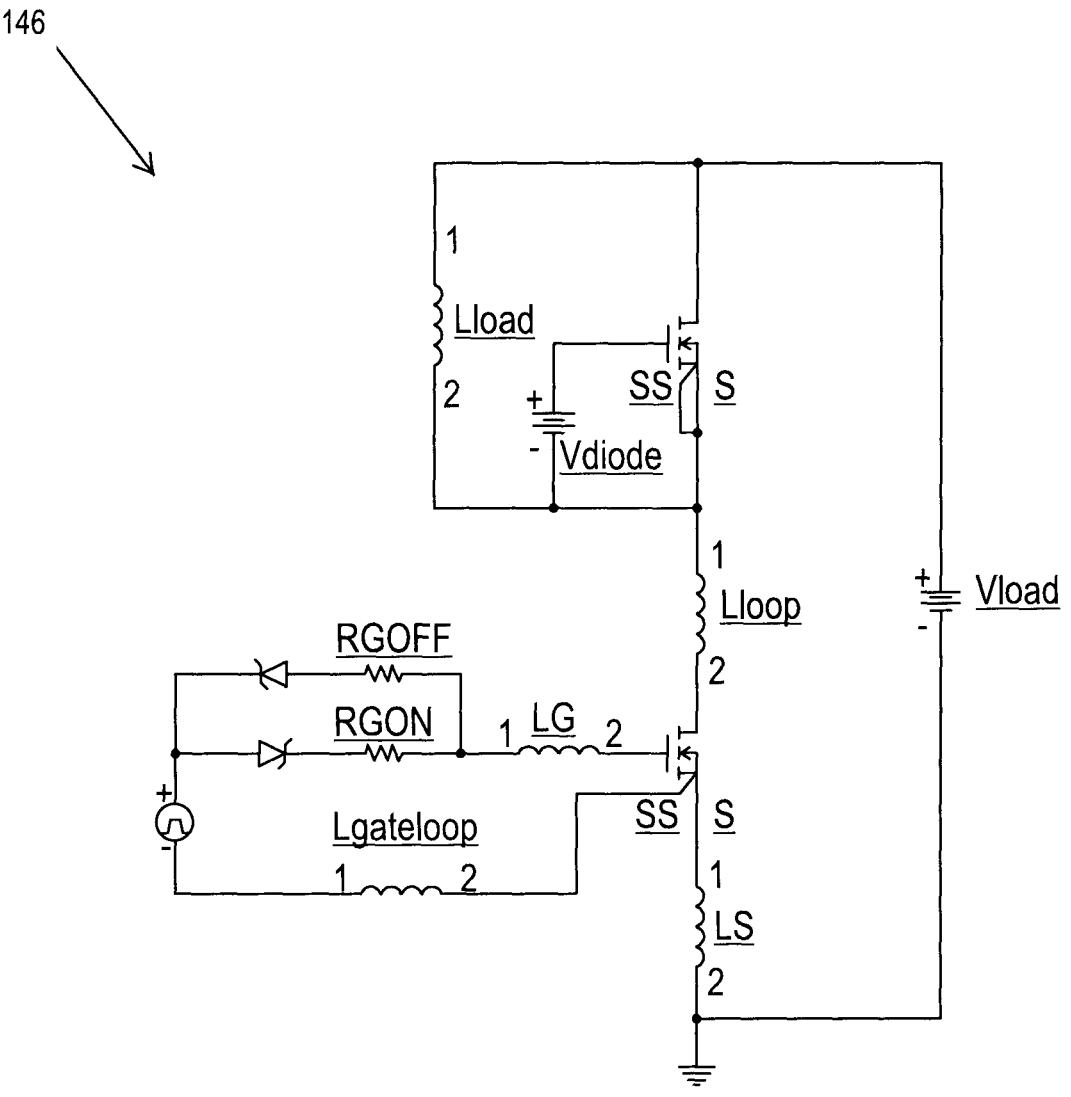
FIG. 9 illustrates an implementation of a circuit schematic included in the corresponding portion of FIG. 4.

Referring to FIG. 4, an implementation of a fourth interface 140 is illustrated that is used by the user to enter specific circuit characteristics. These circuit characteristics may include various circuit parasitic values and other circuit values that relate to a circuit schematic 142 included on the interface. The circuit schematic 142 is a schematic of the circuit used to create the switching loss data for with the product SPICE model selected by the user. By being able to select circuit parasitics, the user is able to ensure that the switching loss values in the resulting product system model file are as accurate as desired for the designer's end system application. An example circuit schematic 146 that has the components associated with the values in the data table 144 of FIG. 4 is illustrated in FIG. 9. In various implementations, certain parasitics of interest like those illustrated in FIG. 9 and the data table 144 may be included, though in other implementations, other parasitics could be included/replace any of the parasitics illustrated in FIG. 4.

By non-limiting example, the RGON and RGOFF parasitic may have a typical range of between 0 to about 20 Ohms and represents the gate resistance that modulates the speed of the device turn on/off process which affects the switching loss(es). The Gate Inductance (LG) may have a value of between about 1 to about 50 nano Henries and works as a parasitic to affect the Vgs waveform causing an overshoot at plateau voltage during turn on (the inductance acting as a current source) which helps the turn on speed and correspondingly lowers the turn on loss(es). Another parasitic may include the Gate Loop Inductance (Lgateloop) which may have a value between about 1 to 50 nano Henries. The Gate Loop Inductance may not have a large impact on losses during turn off, but it works to increase Tdoff (turn off delay). In some extreme cases, this inductance can cause slow Vgs waveforms and high loss(es). Also, inductances in the gate can cause oscillations with a gate of another device(es) and cause additional corresponding ringing losses. The Source Inductance (LS) may have a value between about 1 to about 20 nano Henries and may cause losses because it lowers Eon because of voltage drop caused by the inductance during positive di/dt and increased Eoff because of voltage overshoot for negative di/dt. This inductance may also slow down the di/dt of the drain current which influence loss(es) in the circuit. Another parasitic that may be included/considered is the Loop Inductance which may have a range of values between about 10 to about 200 nano Henries. Any of a wide variety of other generally present parasitics and/or circuit specific parasitics may be included in the fourth interface 140 to allow the user to enter value(s) and/or ranges of values for use during the simulation process. In the various system and method implementations, when the user presses the Submit button on the fourth interface 140, the values of the various circuit characteristics are provided to the SPICE model simulation module 110. In various system and method implementations, this also represents the point in the method when the SPICE model simulation model 110 uses all of the input provided and the product SPICE model to generate a SPICE model output which is then formatted by the formatting module 112 to a desired file format.

Referring to FIGS. 5 and 6, an illustration of first and second portions of a system model file that includes a structured text file formatted in a PLECS format is illustrated. In this implementation, the format of the structured text file is xml. FIG. 5 shows the associated data for Eon versus Rg across a set of y axis dimensional values which can be plotted into curves to allow the designer to observe the system behavior over the product package's dimensions. FIG. 6 illustrates a set of voltage values for each of a set of different temperature values. This ability to do simulations of voltage response for each of a set of different temperature values can be invaluable to the circuit designed who needs to understand the heat dissipation needs for a given products across the different temperature levels. FIGS. 7 and 8 illustrate output of a plain text file or comma separated text file that is being viewed using the spreadsheet program marketed under the tradename EXCEL® by Microsoft Corporation of Redmond, WA. However, in some implementations, through scripting like that discussed, the formatting module 112 can directly output a file in an xlsx format or any other structured file format desired. FIG. 7 shows temperature dependent Eoff, Eon, and Err at each of four possible operating temperatures and a set of diode voltages (IDs). FIG. 8 illustrates DC characteristics for MOSFET at a set of IDs and set of temperatures showing the effect of temperature on RDson. These modeled data points in the product system model file implementations can then be used by a system level simulator to allow a circuit designer to evaluate whether a certain device will work in a given circuit design and/or how best to integrate it thermally and/or electrically.

Figure 10:
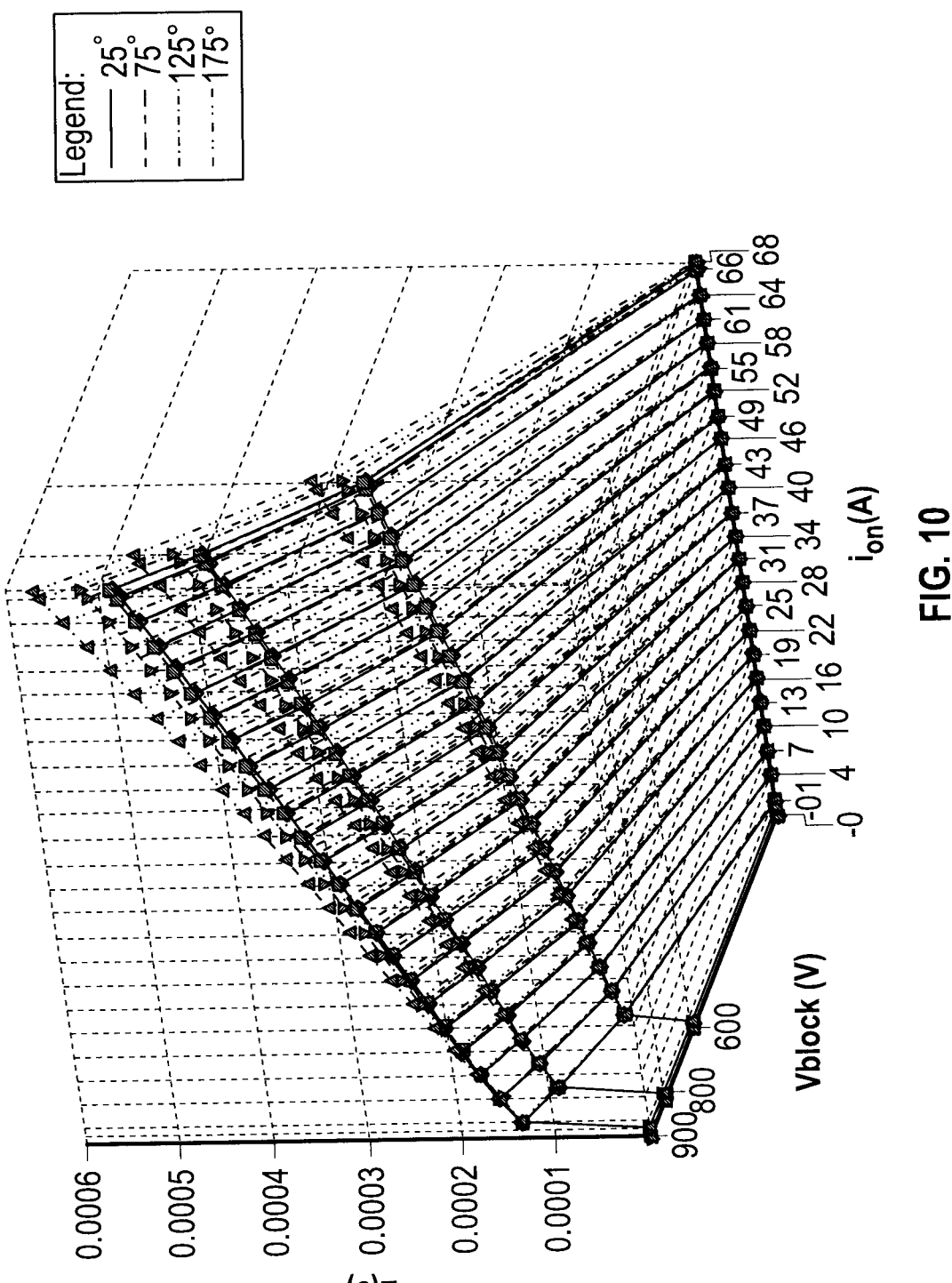
FIG. 10 is a three-dimensional graph of system level simulation data from a system simulator using a system model file.
Figure 11:
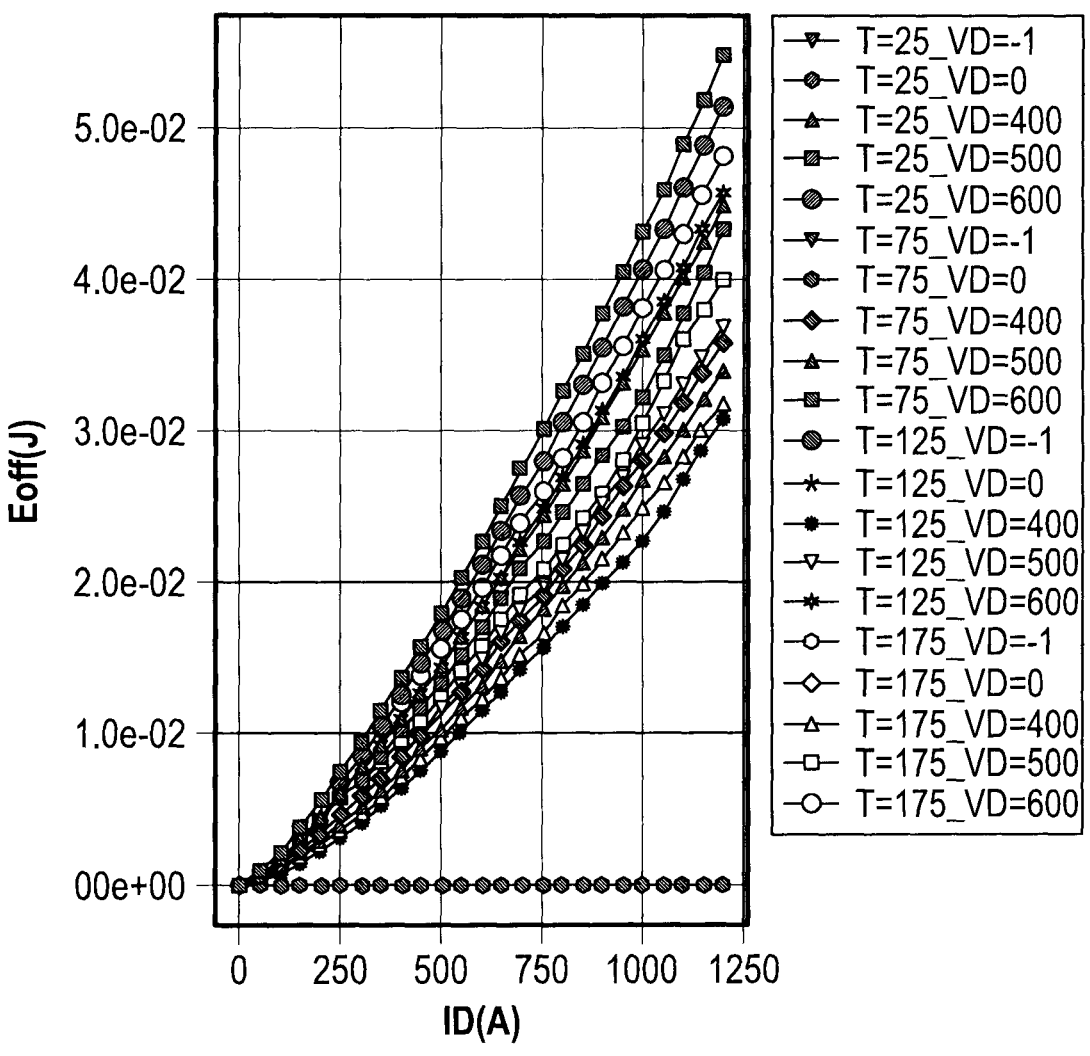
FIG. 11 is a graph of system level simulation data for Eoff switching loss at different temperatures and voltages versus diode current (ID) obtained using a system model file.
Figure 12:
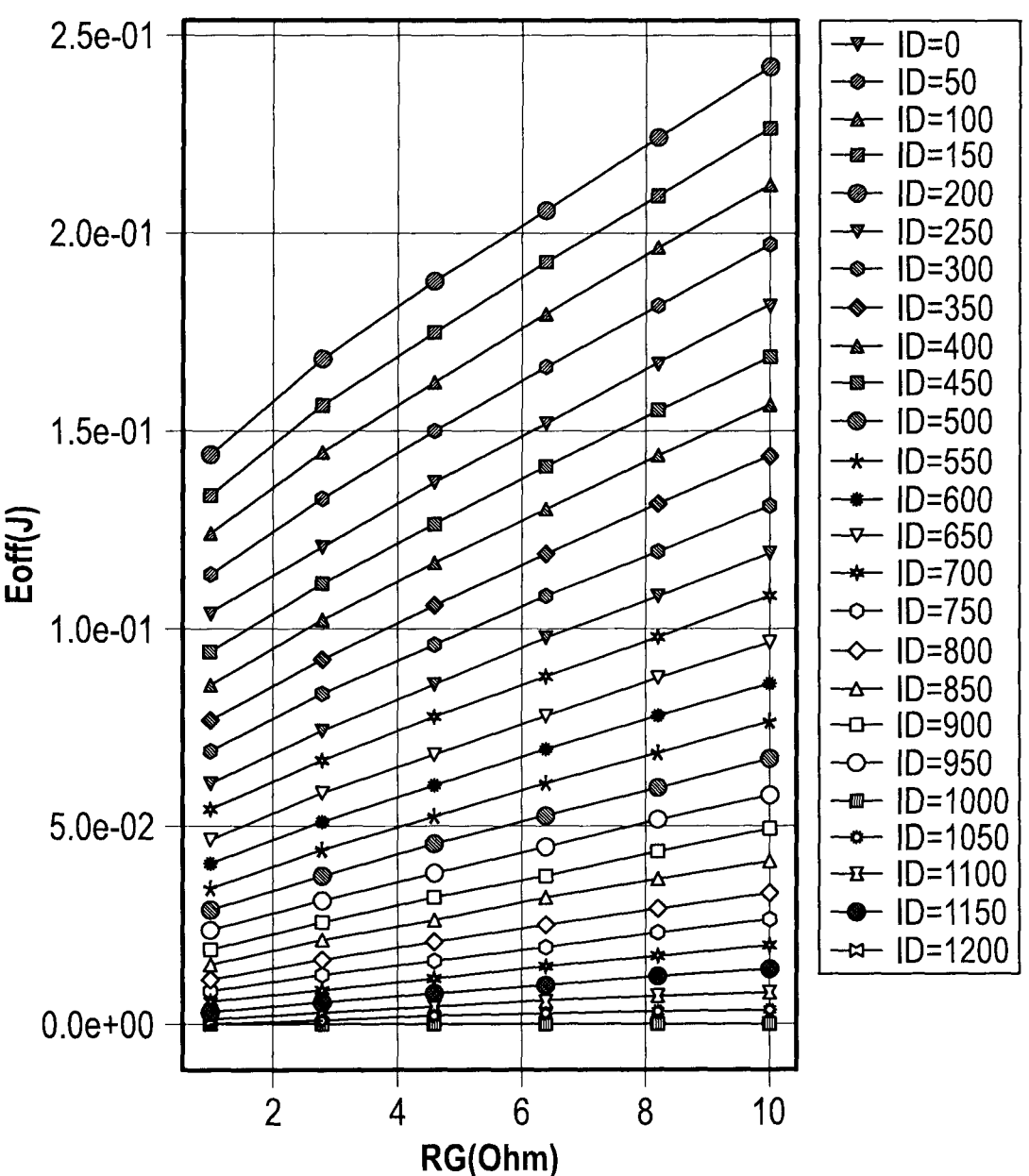
FIG. 12 is a graph of system level simulation data for Eoff switching loss at different diode currents (ID) obtained using a system model file.
Figure 13:
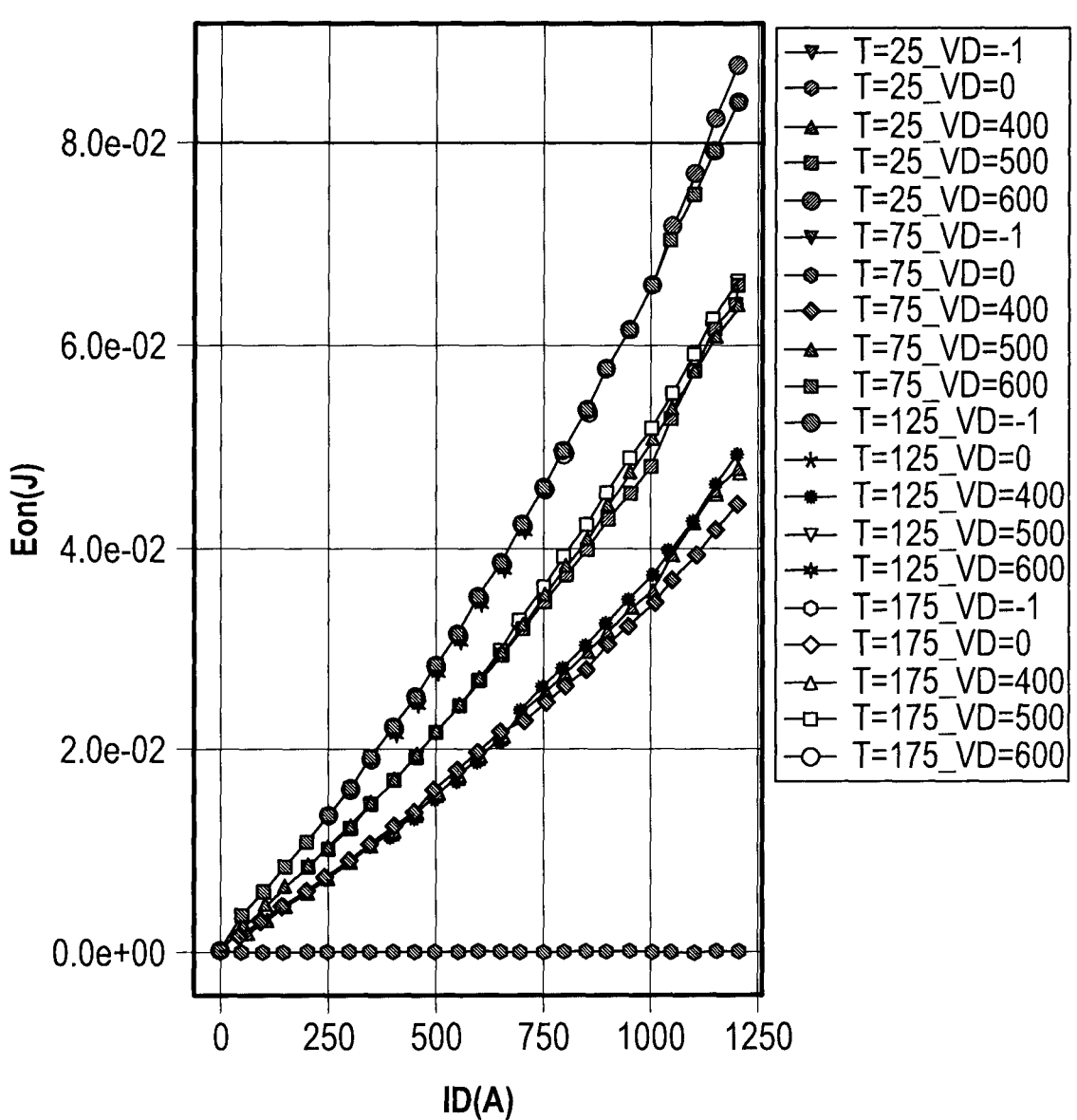
FIG. 13 is a graph of system level simulation data for Eoff switching loss at different diode currents (ID) at different temperatures obtained using a system model file.
Figure 14:
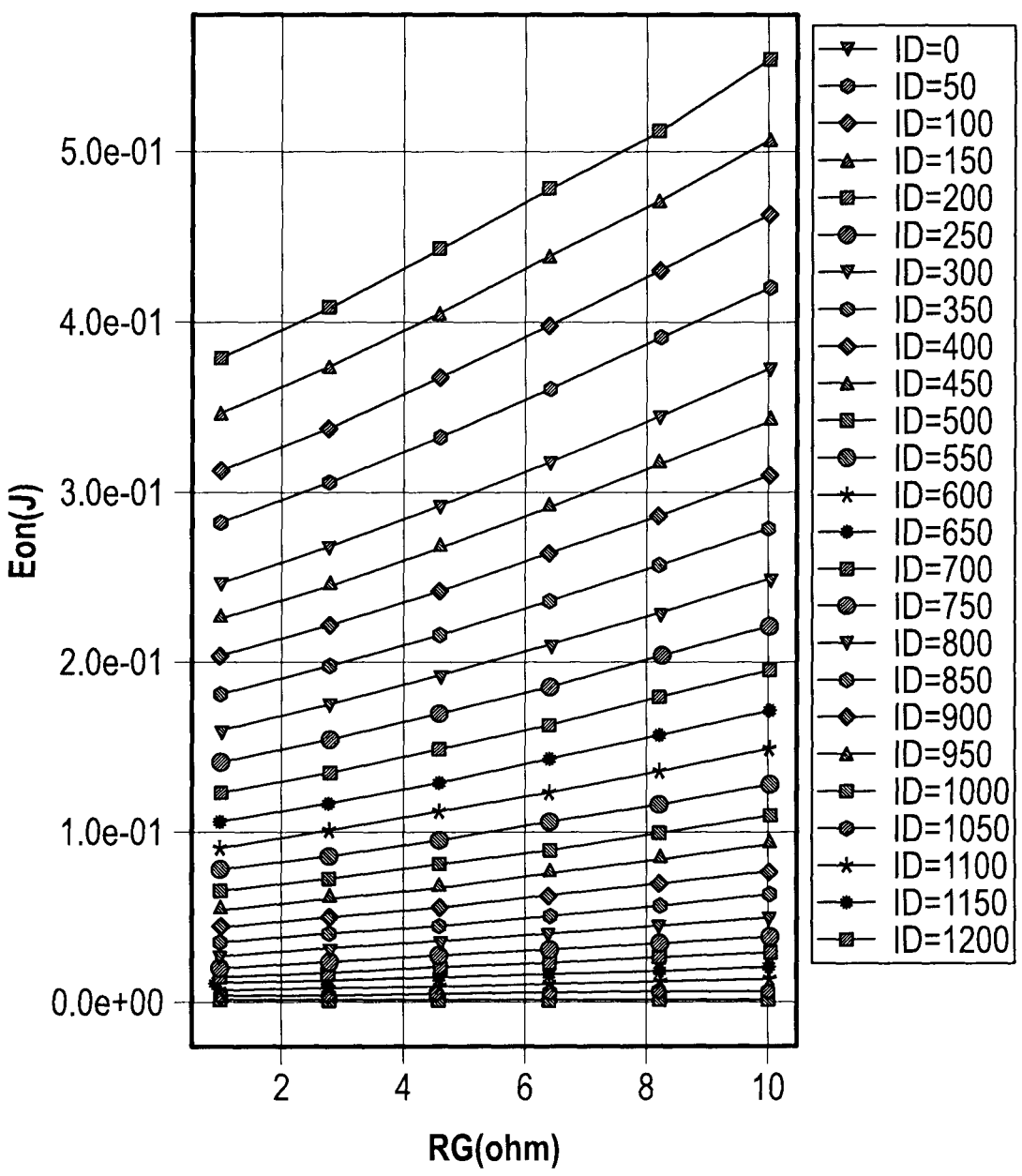
FIG. 14 is a graph of system level simulation data for Eon switching loss at different diode currents (ID) obtained using a system model file.
Figure 15:
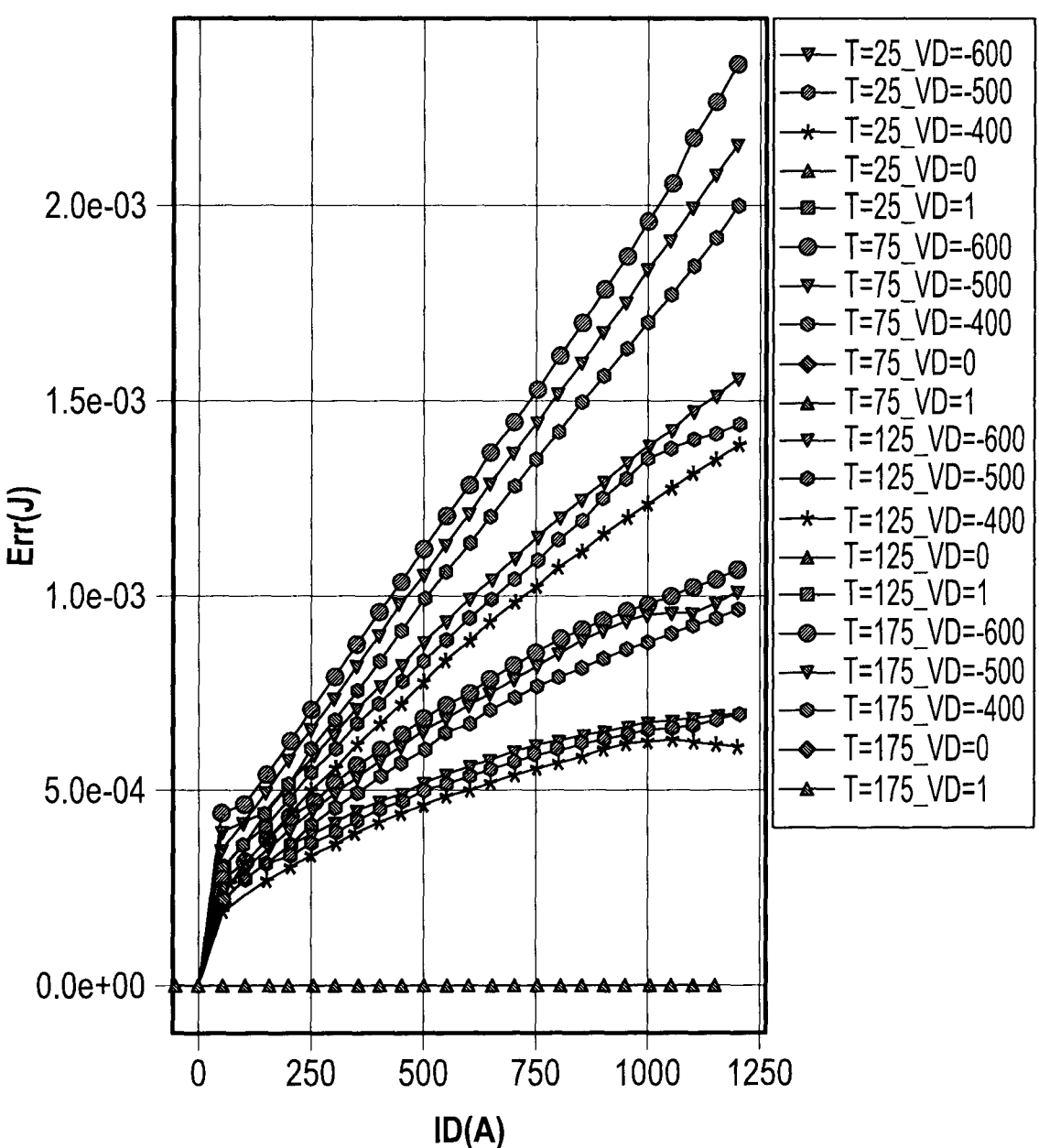
FIG. 15 is a graph of system level simulation data for Eon switching loss at different diode currents (ID) and temperatures obtained using a system model file.
Figure 16:
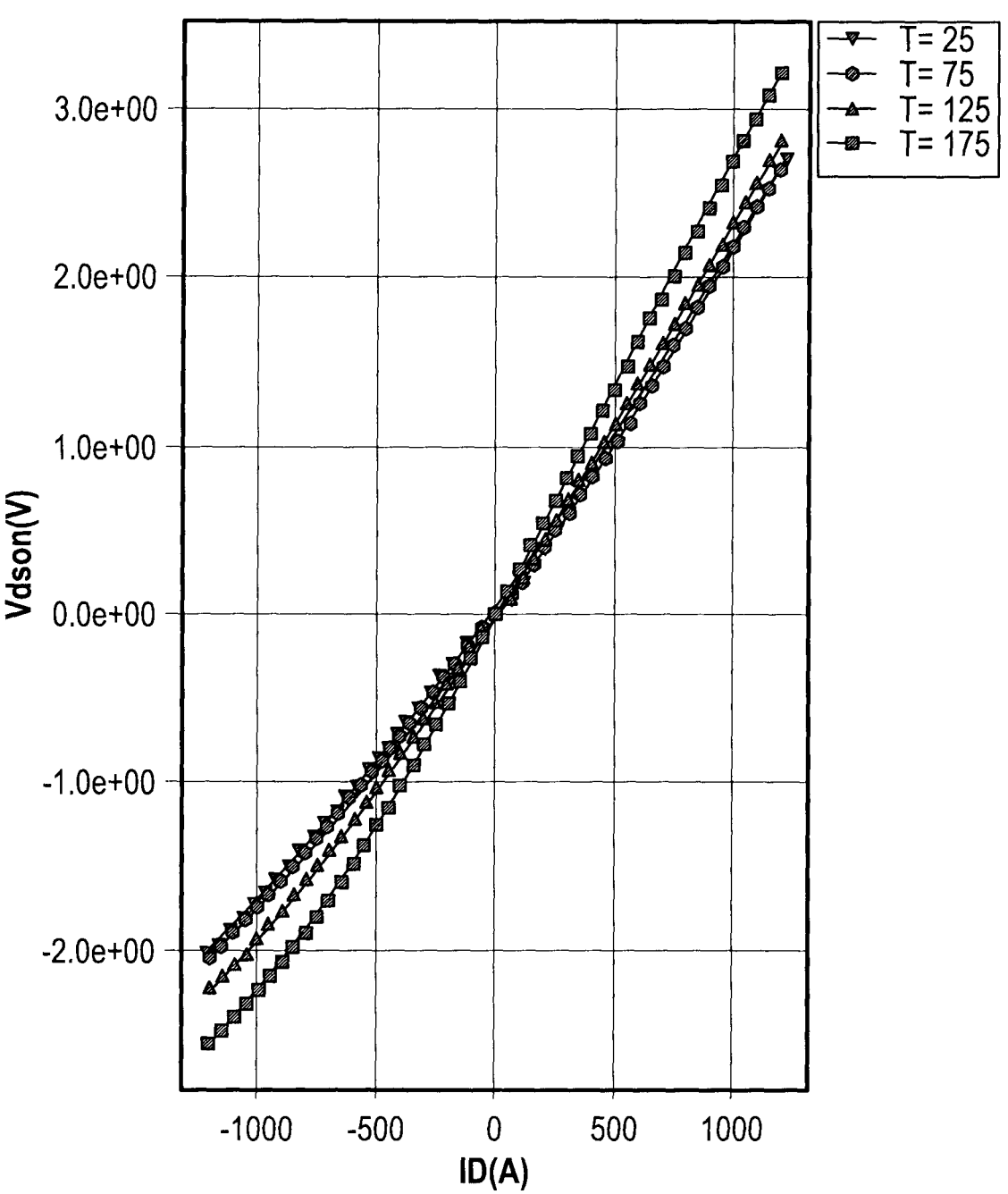
FIG. 16 is a graph of system level simulation data for Vdson switching loss at different diode currents and temperatures.
Figure 17:
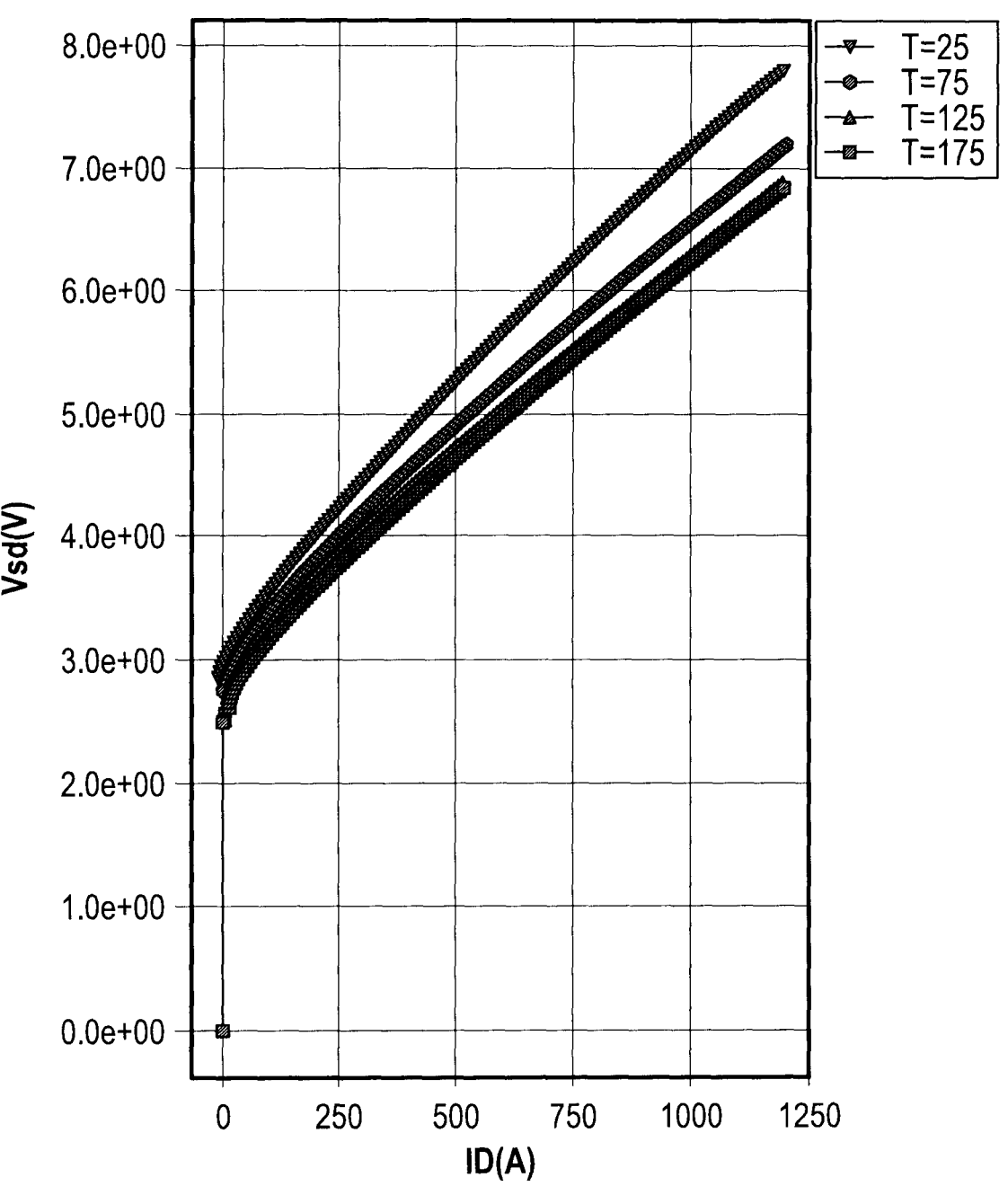
FIG. 17 is a graph of system level simulation data for Vsd (voltage source-drain) at different diode currents and temperatures.

FIG. 10 illustrates an output of a system level simulator that shows a surface where energy E is graphed versus Vblock for various on currents (ion) at four different temperature values. All of the data in this output was derived from a PLECS formatted product system model file and is the result of either plotting of direct data values or interpolation/extrapolation by the system level simulator. FIGS. 11-17 are similar two dimensional outputs from a system level simulator using a PLECS formatted product system model file. FIG. 11 shows a graph of Eoff versus diode current ID for a set of different temperatures at different diode voltages. FIG. 12 is a graph of Eoff versus gate resistance (RG) for a set of diode currents ID. FIG. 13 is a graph of Eon versus diode current (ID) for over a range of temperatures at different diode voltages (VD). FIG. 14 is a graph of Eon versus gate resistance RG for a set of diode current value ID. FIG. 15 is a graph of Err versus diode current ID for a set of temperature values and diode voltages VD. FIG. 16 is a graph of Vdson versus a set of diode currents ID for four different temperatures. FIG. 17 is a graph of Vsd versus diode current ID for four different temperatures as well. These graphs illustrated the significant degree of data granularity available to the system level simulator for these calculations from the product system model file generated using the system and method implementations disclosed herein. This type of data granularity generally not available using laboratory techniques nor available with the same degree of accuracy. Furthermore, the ability to enter and adjust values for parasitics can help the circuit designer understand the product's sensitivity to parasitics. In various products, some parasitic effects get better or worse depending on the type of parasitic. To aid in observing the effects of the parasitics, the modeling can also be carried out to sacrifice some performance parameters. For example, some Eoff can be given up to get better Eon to understand the effects of the parasitics.

The SPICE model simulation module 110 operates using the system characteristics and operating characteristics in various ways to generate each of the desired performance characteristics included in the product system model file. For example, with the defined current values, the module 110 sweeps the current at a given VGS value, measuring the resulting IV to get the conduction loss for a MOSFET diode. In various module implementations, double pulse simulations may be used to get the energy losses using the product SPICE model. In various system implementations, the conduction losses/energies are calculated using IV sweeps with the product SPICE model. Because the SPICE model simulation module 110 can work with the product SPICE model, it can perform the simulations on ideal conditions without interference from the parasitics of a lab set up.

The ability to input circuit parasitics and characteristics to the SPICE model simulation module 110 further allows the establishment of boundary conditions for each simulation where the parasitics are the boundary conditions. However, for IV sweeps used to test switching characteristics, the parasitics input may not be used. Because the product SPICE model implementations used with the SPICE model simulation module 110 may also include a thermal model, the SPICE model simulation module 110 can include a thermal impedance network such as a Cauer or Foster network in the product system model file. This may be done in various implementations by the SPICE model simulation module 110 extracting the thermal model and adding it to the product system model file. In various system and method implementations, however, additional thermal characteristics can be added to allow the modeling to be conducted with corner thermal models and a Cauer network or Foster network that is used by the module to perform additional thermal modeling for inclusion in the product system model file. These corner thermal models could include a typical operating case or a worst case (high temperature, low temperature, or both). In such implementations, in addition to the circuit schematic, different representations of particular thermal networks that can be used may be selectable by the user. The product system model file generated by the SPICE model simulation module 110 is a part-level model valid for use in system-level simulations but is not actually itself a SPICE model but rather a table model that contains the performance data needed for the system level simulator to use it for its simulation work.

In various system implementations, the SPICE model output of the SPICE model simulation module 110 needs additional formatting to be organized into the format desired for the product system model file. Various implementations of formatting modules 112 may utilize scripts and other programs to automatically perform the data rearrangement. In various implementations, the scripts may be Python language scripts. Following the desired formatting and formation of the product system model file by the formatting module 112, the resulting product system model file may be made available for immediate downloading to the user via the user interfaces and/or may be saved into the database 114 for later downloading/access by the user or another user who wishes to use the file. In various implementations, the product system model file may be made available by a semiconductor device manufacturer along with the datasheet for each particular product being manufactured.

The various system implementations disclosed herein may utilize various implementations of a method of generating a product system model for use in system level simulations. Referring to FIG. 19, a flow diagram of a method implementation is illustrated. As illustrated, the method 148 may include using a first interface generated by a computing device to receive from a user a selection of a product type (step 150) and selecting, using a processor, a product SPICE model associated with the product type from a database of product SPICE models (step 152). The database may be any database disclosed herein and the computing device may be any computing device implementation disclosed herein. The method also includes using a second interface generated by the computing device to receive from the user a selection of a process condition (step 154) and using a third interface generated by the computing device to receive from the user one or more system characteristics and one or more operating characteristics (step 156). The process condition, one or more system characteristics, and one or more operating characteristics may be any disclosed in this document. The method also includes using a fourth interface generated by the computing device to receive from the user one or more circuit characteristics, which may be any of the circuit characteristics including parasitics disclosed herein (step 158). The method also includes using the processor and a SPICE simulation module to generate a SPICE model output with the product SPICE module, the process condition, the one or more systems characteristics, the one or more operating characteristics, and the one or more circuit characteristics (step 160). The SPICE simulation module may be any disclosed in this document and the method of simulation carried out may be any disclosed herein. The method also includes using the processor and a formatting module to format the SPICE model output into a product system model file which may be a structured text file, a plain text file, or a delimited text file like any disclosed herein. A wide variety of method implementations may be constructed using the principles disclosed herein.

The various semiconductor devices for which the disclosed system and method implementations may be employed may be any of a wide variety of device types, including, by non-limiting example, metal oxide semiconductor field effect transistors (MOSFETs), insulated gate bipolar transistors (IGBITs), diodes, power semiconductor devices, silicon controlled rectifiers, transistors, or any other semiconductor device type. Also, the various product types may include a single die, two die, or multiple die included in a module. Those of ordinary skill will readily appreciate how to adapt the principles disclosed herein to various semiconductor die or device types.

In places where the description above refers to particular implementations of systems and methods for generating product system models for use in system level simulators and implementing components, sub-components, methods and sub-methods, it should be readily apparent that a number of modifications may be made without departing from the spirit thereof and that these implementations, implementing components, sub-components, methods and sub-methods may be applied to other systems and methods for generating product system models for use in system level simulators.

What is claimed is:

1. A method of generating a product system model for use in system level simulations, the method comprising:

using a first interface generated by a computing device, receiving from a user a selection of a product type;

selecting, using a processor, a product SPICE model associated with the product type from a database of product SPICE models;

using a second interface generated by the computing device, receiving from the user a selection of a process condition;

using a third interface generated by the computing device, receiving from the user one or more system characteristics and one or more operating characteristics;

using a fourth interface generated by the computing device, receiving from the user one or more circuit characteristics;

using the processor and a SPICE model simulation module, generating a SPICE model output with the product SPICE model, the process condition, the one or more system characteristics, the one or more operating characteristics, and the one or more circuit characteristics; and using the processor and a formatting module, formatting the SPICE model output into a product system model file, the product system model file comprising one of a structured text file, a plain text file, or a delimited text file.

2. The method of claim 1, wherein the product system model file is configured to be used to perform a system level simulation of a system comprising the product type.

3. The method of claim 1, wherein receiving from the user the selection of the product type further comprises receiving a selection of one of a product die type, a product technology type, a product voltage level, a device type, and any combination thereof.

4. The method of claim 1, wherein receiving from the user the selection of the process condition further comprises receiving a selection of one of a nominal condition, a worst conduction loss/best case switching loss, or a best case conduction loss/worst case switching loss.

5. The method of claim 1, wherein the one or more system characteristics comprise one of a number of devices and one or more temperatures.

6. The method of claim 1, wherein the one or more operating characteristics further comprises one of at least one direct current characteristic, at least one switching characteristic, at least one gate threshold voltage, or any combination thereof.

7. The method of claim 1, wherein the one or more circuit characteristics further comprise one of gate resistance, gate inductance, gate loop inductance, source inductance, loop inductance, diode voltage, and any combination thereof.

8. The method of claim 1, wherein the fourth interface further comprises a circuit schematic.

9. The method of claim 1, wherein the product system model file is a structured text file configured to be used by a Piecewise Linear Electrical Circuit Simulation system.

10. The method of claim 1, wherein the product type comprises a discrete power semiconductor die.

11. A system for generating a system model for use in system level simulations, the system comprising:

one or more hardware processors configured by machine-readable instructions to:

use a first interface generated by a computing device to receive from a user a selection of a product type;

select a product SPICE model associated with the product type from a database of product SPICE models;

use a second interface generated by a computing device to receive from the user a selection of a process condition;

use a third interface generated by a computing device to receive from the user one or more system characteristics and one or more operating characteristics;

use a fourth interface generated by a computing device to receive from the user one or more circuit characteristics;

use a SPICE model simulation module to generate a SPICE model output with the product SPICE model, the process condition, the one or more system characteristics, the one or more operating characteristics, and the one or more circuit characteristics; and use a formatting module to format the SPICE model output into a product system model file, the product system model file comprising one of a structured text file, a plain text file, or a delimited text file.

12. The system of claim 11, wherein the product system model file is configured to be used to perform a system level simulation of a system comprising the product type.

13. The system of claim 11, wherein the selection of the product type further comprises a selection of one of a product die type, a product technology type, a product voltage level, a device type, and any combination thereof.

14. The system of claim 11, wherein the selection of the process condition further comprises a selection of a nominal condition, a worst conduction loss/best case switching loss, or a best case conduction loss/worst case switching loss.

15. The system of claim 11, wherein the one or more system characteristics comprise one of a number of devices and one or more temperatures.

16. The system of claim 11, wherein the one or more operating characteristics further comprises one of at least one direct current characteristic, at least one switching characteristic, at least one gate threshold voltage, or any combination thereof.

17. The system of claim 11, wherein the one or more circuit characteristics further comprise one of gate resistance, gate inductance, gate loop inductance, source inductance, loop inductance, diode voltage, and any combination thereof.

18. The system of claim 11, wherein the fourth interface further comprises a circuit schematic.

19. The system of claim 11, wherein the product system model file is a structured text file configured to be used by a Piecewise Linear Electrical Circuit Simulation system.

20. The system of claim 11, wherein the product type comprises a discrete power semiconductor die.

* * * * *